United States Patent
Hammond et al.

(10) Patent No.: US 11,355,340 B2
(45) Date of Patent: Jun. 7, 2022

(54) SEMICONDUCTOR MATERIAL HAVING TUNABLE PERMITTIVITY AND TUNABLE THERMAL CONDUCTIVITY

(71) Applicant: IQE plc, Cardiff (GB)

(72) Inventors: Richard Hammond, Newport (GB); Drew Nelson, Vale of Glamorgan (GB); Alan Gott, Bristol (GB); Rodney Pelzel, Emmaus, PA (US); Andrew Clark, Mountain View, CA (US)

(73) Assignee: IQE plc, Cardiff (GB)

( * ) Notice: Subject to any disclaimer, the term of this patent is extended or adjusted under 35 U.S.C. 154(b) by 0 days.

(21) Appl. No.: 16/742,827

(22) Filed: Jan. 14, 2020

(65) Prior Publication Data
US 2021/0020436 A1    Jan. 21, 2021

Related U.S. Application Data

(60) Provisional application No. 62/891,885, filed on Aug. 26, 2019, provisional application No. 62/876,330, filed on Jul. 19, 2019.

(51) Int. Cl.
*H01L 21/02* (2006.01)
*H01L 21/306* (2006.01)
(Continued)

(52) U.S. Cl.
CPC .. *H01L 21/02381* (2013.01); *H01L 21/02002* (2013.01); *H01L 21/02203* (2013.01);
(Continued)

(58) Field of Classification Search
CPC ......... H01L 21/02381; H01L 21/02203; H01L 21/02505; H01L 21/02293; H01L 21/3063;
(Continued)

(56) References Cited

U.S. PATENT DOCUMENTS 5,206,523 A * 4/1993 Goesele ................. H01L 31/028
257/E21.216
5,439,843 A * 8/1995 Sakaguchi ........ H01L 21/76256
438/479
(Continued)

FOREIGN PATENT DOCUMENTS

EP    0 932 204    7/1999
EP    2 641 265    9/2013

OTHER PUBLICATIONS

Anderson et al. (Investigations of the Electrical Properties of Porous Silicon), J. Electrochem. Soc., vol. 138, No. 11, (Nov. 1991) (Year: 1991).*
Sarafis et al.—Porous Si as a Substrate for the Monolithic Integration on RF and Millimeter-Wave Passive Devices (transmission lines, inductors, filters and antennas: Current state-of-art and perspectives, Applied Physics Reviews 4, 031102 (Year: 2017).*
(Continued)

*Primary Examiner* — Errol V Fernandes
*Assistant Examiner* — Jeremy J Joy
(74) *Attorney, Agent, or Firm* — Sterne, Kessler, Goldstein & Fox P.L.L.C.

(57) ABSTRACT

A layered structure for semiconductor application is described herein. The layered structure includes a starting material and a fully depleted porous layer formed over the starting material with high resistivity. In some embodiments, the layered structure further includes epitaxial layer grown over the fully depleted porous layer. Additionally, a process of making the layered structure including forming the fully depleted porous layer and epitaxial layer grown over the porous layer is described herein.

28 Claims, 20 Drawing Sheets

(51) Int. Cl.
  *H01L 21/3063* (2006.01)
  *H01L 23/66* (2006.01)
  *H01L 29/04* (2006.01)
  *H01L 29/06* (2006.01)

(52) U.S. Cl.
  CPC .. *H01L 21/02293* (2013.01); *H01L 21/02505* (2013.01); *H01L 21/306* (2013.01); *H01L 21/3063* (2013.01); *H01L 23/66* (2013.01); *H01L 29/045* (2013.01); *H01L 29/0607* (2013.01); *H01L 21/02513* (2013.01)

(58) Field of Classification Search
  CPC ............ H01L 29/045; H01L 21/02513; H01L 21/0245; H01L 21/02532; H01L 21/02507; H01L 21/0251; H01L 21/02433
  See application file for complete search history.

(56) References Cited

U.S. PATENT DOCUMENTS

| | | | | |
|---|---|---|---|---|
| 6,103,590 | A * | 8/2000 | Swanson | H01L 21/3081 257/E21.054 |
| 6,107,213 | A * | 8/2000 | Tayanaka | H01L 21/0245 257/E21.216 |
| 6,284,671 | B1 * | 9/2001 | Schmuki | H01L 21/30635 257/E21.216 |
| 6,376,859 | B1 * | 4/2002 | Swanson | H01L 21/02203 257/E21.216 |
| 6,677,183 | B2 * | 1/2004 | Sakaguchi | H01L 21/78 257/E21.216 |
| 6,891,578 | B2 * | 5/2005 | Yonehara | G02F 1/13454 349/47 |
| 10,347,597 | B2 | 7/2019 | Kononchuk et al. | |
| 2002/0100941 | A1 * | 8/2002 | Yonehara | H01L 25/0655 257/E21.216 |
| 2003/0190794 | A1 * | 10/2003 | Ohmi | H01L 21/2007 257/E21.122 |
| 2004/0005740 | A1 * | 1/2004 | Lochtefeld | H01L 29/7847 257/E21.127 |
| 2004/0031979 | A1 * | 2/2004 | Lochtefeld | H01L 29/66916 257/233 |
| 2004/0245571 | A1 * | 12/2004 | Cheng | H01L 21/02488 257/E21.12 |
| 2005/0221591 | A1 * | 10/2005 | Bedell | H01L 21/02381 257/E21.216 |
| 2011/0250416 | A1 * | 10/2011 | Bruel | B32B 5/20 257/E21.567 |
| 2012/0055236 | A1 * | 3/2012 | Takulapalli | G01N 27/4145 257/253 |
| 2013/0294038 | A1 * | 11/2013 | Landru | H01L 21/76254 438/455 |
| 2016/0071760 | A1 * | 3/2016 | Liu | H01L 21/02167 257/506 |
| 2016/0268123 | A1 * | 9/2016 | de Souza | H01L 21/0245 |
| 2016/0372568 | A1 * | 12/2016 | Posseme | H01L 29/66628 |
| 2017/0062284 | A1 * | 3/2017 | Mason | H01L 21/7624 |
| 2017/0170025 | A1 * | 6/2017 | Dahal | H01L 29/872 |
| 2017/0221839 | A1 * | 8/2017 | Kononchuk | H01L 41/042 |
| 2018/0068886 | A1 * | 3/2018 | Hammond | H01L 21/76256 |
| 2019/0131454 | A1 * | 5/2019 | Goktepeli | H01L 21/0203 |
| 2019/0172923 | A1 * | 6/2019 | Pelzel | H01L 29/517 |
| 2019/0181218 | A1 * | 6/2019 | Goktepeli | H01L 21/8258 |

OTHER PUBLICATIONS

Wallner—Porous silicon technology for integrated microsystems, PhD dissertation, Electrical and Computer Engineering Department, MTU, Houghton, MI (Year: 2006).*
Gautier et al.—Porous silicon for electrical isolation in radio frequency devices: A review, Applied Physics Reviews 1, 011101 (Year: 2014).*
Lehmann et al.—The Physics of Macropore Formation in Low-Doped p-Type Silicon, Journal of The Electrochemical Society, 146 (8) 2968-2975 (Year: 1999).*
Kim et al.—Strong Anisotropic Thermal Conductivity of Nanoporous Silicon, Journal of Applied Physics, 118, 154304 (Year: 2015).*
Sarafis et al., Porous Si as a Substrate for the Monolithic Integration on RF and Millimeter-Wave Passive Devices (transmission lines, inductors, filters and antennas): Current state-of-art and perspectives, Applied Physics Reviews 4, 031102 (2017) (Year: 2017).*
Gautier et al., Porous silicon for electrical isolation in radio frequency devices: A review, Applied Physics Reviews 1, 011101 (2014) (Year: 2014).*
Anderson et al. (Investigation of the Electrical Properties of Porous Silicon, J Electrochem Soc.,vol. 138, No. 11 (Year: 1991).*
Sarafis et al. (Porous Si as a Substrate for the Monolithic Integration on RF and Millimeter-Wave Passive Devices (transmission J lines, inductors, filters and antennas): Current state-of-art and perspectives, Applied Physics Reviews 4, 031102 (2017) (Year: 2017 ).*
Kim et al. (Strong Anisotropic Thermal Conductivity of Nanoporous Silicon), Journal of Applied Physics, 118, 154304 (2015) (Year: 2015).*
Wallner, Porous silicon technology for integrated microsystems, PhD dissertation, Electrical and Computer Engineering Department , MTU, Houghton, MI, (2006) (Year: 2006).*
Gautier et al., Porous silicon for electrical isolation in radio frequency devices: A review, Applied Physics Reviews 1, 011101 (2014) I, (2006) (Year: 2006).*
Lehmann et al., The Physics of Macropore Formation in Low-Doped p-Type Silicon, Journal of The Electrochemical Society, 146 (8) 2968-2975 (1999) (Year: 1999).*
Algün et al., "An Investigation of Electrical Properties of Porous Silicon", Istanbul University, Department of Physics, Received Jan. 3, 1999, 9 pages.
Kim et al., "Strong Anisotropic Thermal Conductivity of Nanoporous Silicon", Journal of Applied Physics, 118, 154304 (2015), 6 pages.
Liu et al., Microstructure and Crystallinity of Porous Silicon and Epitaxial Silicon Layers Fabricated on p+Porous Silicon, J. Vac. Sci. Techno. B 21(1), Jan./Feb. 2003, 7 pages.
Lysenko et al., "Thermal Conductivity of Thick Meso-Porous Silicon Layers by Micro-Raman Scattering", Journal of Applied Physics, vol. 86, No. 12, Dec. 15, 1999, 7 pages.
Rack et al., "Small- and Large-Signal Performance Upto 175 ° C. of Low-Cost Porous Silicon Substrate for RF Applications", IEEE Transactions on Electron Devices, vol. 64, No. 5, May 2018, 9 pages.
Sarafis et al., "Porous Si as a Substrate for the Monolithic Integration on RF and Millimeter-Wave Passive Devices (Transmission Lines, Inductors, Filters, and Antennas): Current State-of-Art and Perspectives", Applied Physics Reviews 4, 031102 (2017), 19 pages.
Hussein et al., "Effect of current density and etching time on photoluminescence and energy band gap of p-type porous silicon," Optical and Quantum Electronics Springer Germany, 48: (3) 194 (2016) (8 pages).

* cited by examiner

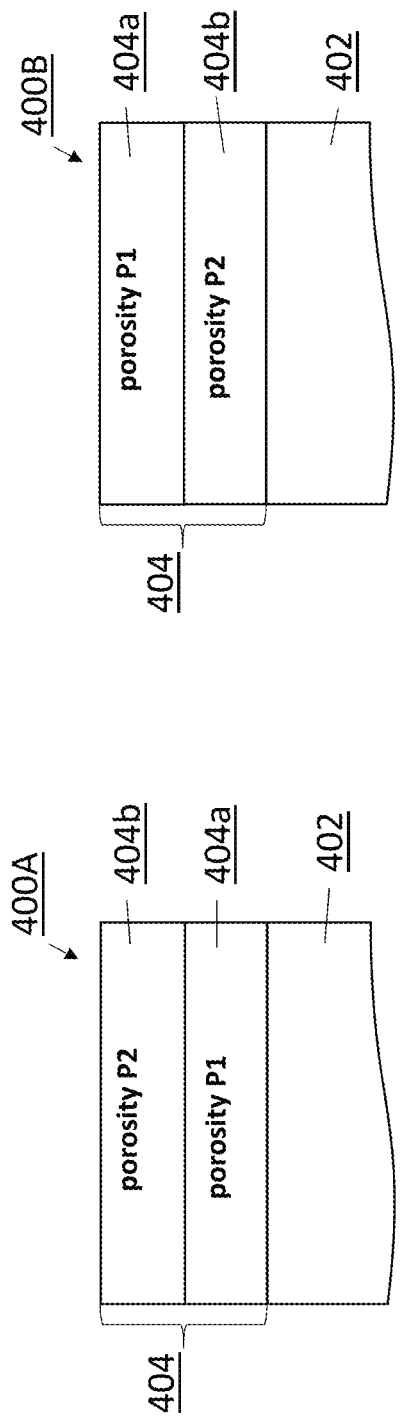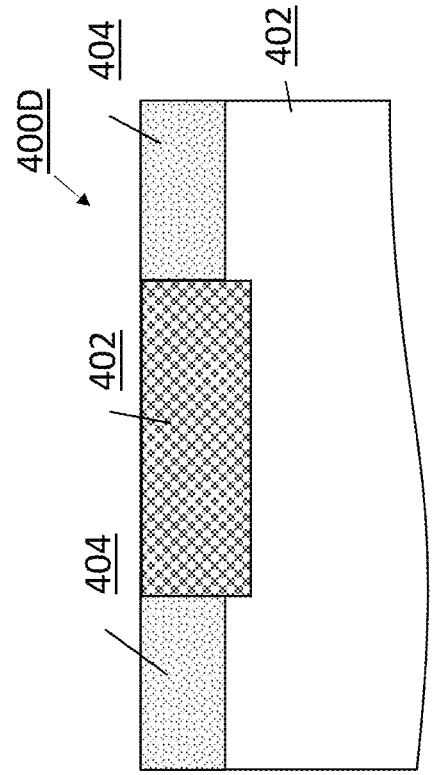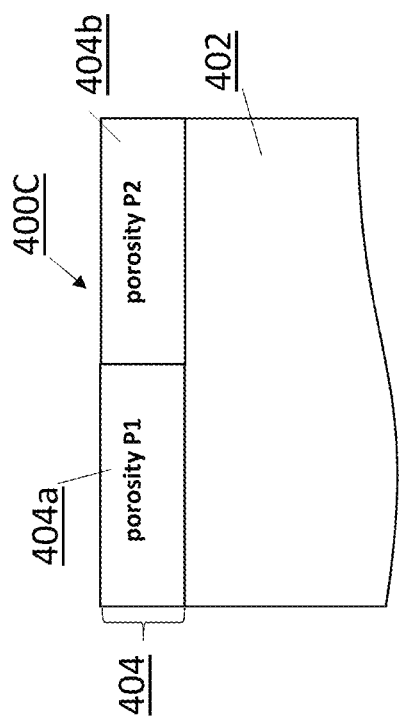

Hi-Lo periodic structure

Buried Hi porous region for wafer separation

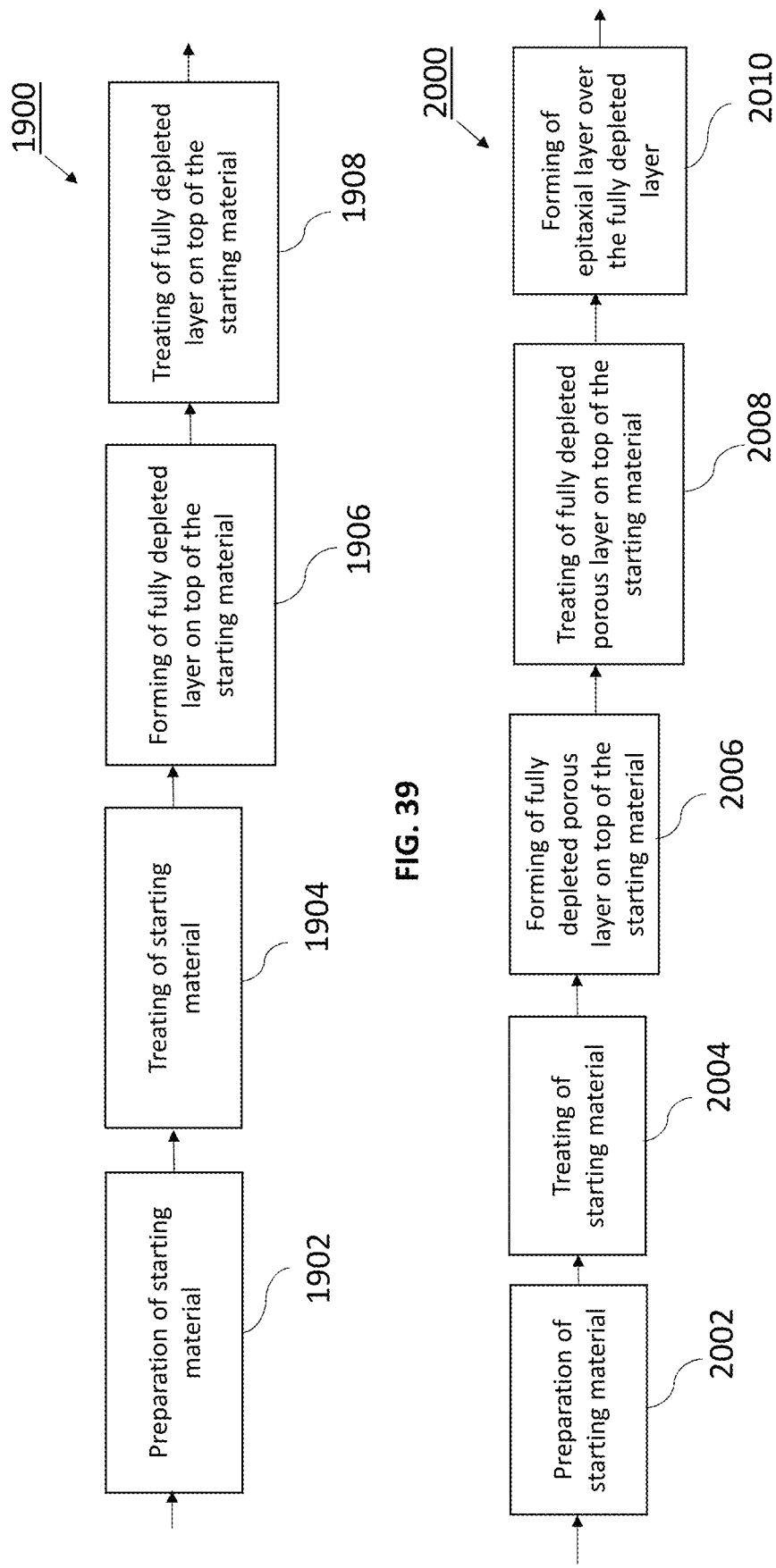

SEMICONDUCTOR MATERIAL HAVING TUNABLE PERMITTIVITY AND TUNABLE THERMAL CONDUCTIVITY

CROSS-REFERENCE TO RELATED APPLICATIONS

This disclosure claims the benefit under 35 U.S.C. § 119(e) of U.S. Provisional Patent Applications Nos. 62/876,330, filed Jul. 19, 2019, and 62/891,885, filed Aug. 26, 2019, each of which is hereby incorporated by reference herein in its respective entirety.

BACKGROUND

Substrates based on silicon (Si) for semiconductor devices have become widespread for radio-frequency (RF) applications. The continuing innovation and rapid development of electronics for radio-frequency communications increasingly demand smaller and faster semiconductor devices. Increasing performance requires substrate technology that minimizes RF losses, RF noise, and nonlinear signal distortion. In particular, Si-based substrates with high effective resistivities and low effective permittivities, such as high-resistivity (HR) low-doped silicon-on-insulator (SOI) substrates, have been shown to significantly reduce RF losses, noise, and signal distortion.

However, effective resistivity of HR-SOI substrates depends greatly on the interface of the Si layer and the buried oxide layer (e.g., $SiO_2$). Existing effective resistivity for HR-SOI substrates is in the range of 20-300 ohm-cm.

A thin porous silicon (pSi) layer inserted between the Si layer and the buried oxide layer of the HR-SOI substrate has demonstrated improved RF performance with high resistivity of greater than 3000 ohm-cm using pSi layer-based structures with porosity greater than 20% and less than 60%. However, high porosity further reduces the thermal conductivity (e.g., porosity greater than 20% may reduce thermal conductivity by greater than 20%), which can lead to severe degradation of the thermal performance of a device. Additionally, silicon oxide ($SiO_2$), a previously known material for this purpose, is a very poor thermal conductor. Specifically, pure silicon starts with a thermal conductivity of approximately 142 W/mK depending on the temperature, but the thermal conductivity of silicon oxide ($SiO_2$) is only approximately 1.5 W/mK, which is barely higher than the thermal conductivity of air, which is 1 W/mK.

SUMMARY

The present disclosure is directed to a layered structure for semiconductor devices. Specifically, the layered structure includes a starting material layer, and a fully depleted porous layer over the starting material. According to such a configuration, the layered structure improves thermal performance of the device while reducing degradation.

In some embodiments, the layered structure includes a starting material, such as a silicon substrate. According to an aspect of this embodiment, all or a portion of the starting material may be converted to form a porous layer with tunable electrical properties. Specifically, the porous layer may be tuned to increase the resistivity of the layered structure while minimizing the loss of thermal properties. Accordingly, the porous layer may be tuned during the conversion or forming to improve the thermal performance of the layered structure while reducing degradation.

According to such a configuration, by carefully tuning the resistivity of a starting material, all or a portion of the starting material can be converted into a layer with resistivity greater than 10,000 ohm-cm and low porosity that will deliver excellent resistivity performance while minimizing the loss of thermal properties. In some aspects of this embodiment, the layered structure is tuned such that the thermal conductivity is equal to at least 3 watts per meter-Kelvin (W/m K).

In some embodiments, by carefully tuning the resistivity of a starting material, all or a portion of the starting material can be converted into a fully depleted porous layer with an increased bandgap that will deliver improved performance at high temperature (i.e., no loss of resistivity during operation).

In some embodiments, the layered structure includes a starting material and a fully depleted porous layer over the starting material. According to an aspect of this embodiment, the band gap of the fully depleted porous layer is tuned to be greater than the band gap of the starting material.

In some embodiments, the fully depleted porous layer is elementally identical to the starting material.

In some embodiments, the layered structure may also include an epitaxial layer formed over the fully depleted porous layer.

In some embodiments, the epitaxial layer includes at least one of silicon, InP, cREO, Mo, AlGaInN, RE-III-N and metal.

In some embodiments, the starting material includes regions of varying resistivity. For example, the starting material may include a plurality of regions, with a first region of the starting material having a first resistivity and a second region of the starting material having a second resistivity. The first resistivity of the first region may be different than the second resistivity of the second region. Additionally, or alternatively, the layered structure may include the fully depleted porous layer over a first region of the starting material and a non-fully depleted porous layer over the second region of the starting material.

In some embodiments, a method of forming the layered structure is provided. For example, the method includes forming a fully depleted porous layer from a starting material, with a first band gap of the fully depleted porous layer that is greater than a second band gap of the starting material.

BRIEF DESCRIPTION OF THE DRAWINGS

The present disclosure, in accordance with one or more various embodiments, is described in detail with reference to the following drawings. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

FIGS. 10-13 show various examples of a layered structure having a fully depleted porous layer of at least two different porosities, in accordance with some embodiments of the present disclosure;

FIG. 39 is a flow diagram of an illustrative process for making a layered structure with a fully depleted porous layer, in accordance with some embodiments of the present disclosure; and FIG. 40 is a flow diagram of an illustrative process for making a layered structure with a starting material layer and forming an epitaxial layer, in accordance with some embodiments of the present disclosure.

DETAILED DESCRIPTION

The present disclosure is directed to a layered structure that allows mixed acoustic, photonic and electronic devices to be integrated on the same platform. For example, the layered structure uses a starting material and a fully depleted porous layer over the starting material, the fully depleted porous layer being tuned to have a resistivity greater than 10,000 ohm-cm while minimizing thermal conductivity loss. For example, the fully depleted porous layer has a band gap that is greater than the band gap of the starting material, while also being elementally identical to the starting material. The layered structure includes the fully depleted porous layer that is tuned to improve the resistivity of the layered structure while minimizing the loss of thermal properties. Such configuration permits the layered structure to minimize the loss of thermal properties while reducing degradation of the layered structure. In this way, the mixed acoustic, photonic and electronic devices can be integrated into the layered structure.

In some embodiments, the layered structure may be formed by forming the fully depleted porous layer from a starting material.

In some embodiments, all or a portion of the starting material may be converted to form a porous layer with tunable electrical properties. The porous layer may be tuned during the conversion or forming to improve resistivity of the layered structure while maintaining the thermal performance and reducing degradation of the layered structure.

Figure 1:
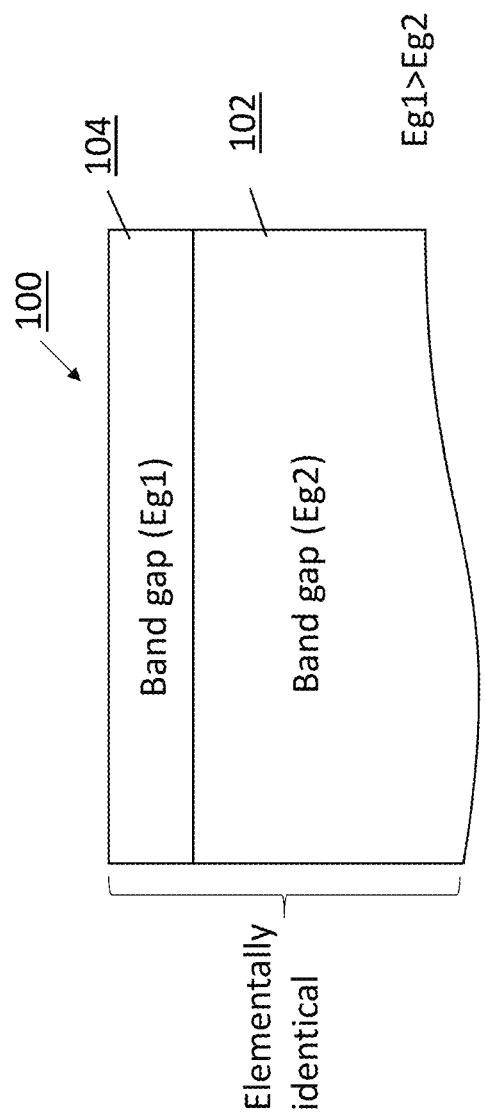
FIG. 1 shows an example of a layered structure having a fully depleted porous layer formed over a starting material, in accordance with some embodiments of the present disclosure.

FIG. 1 shows an example of a layered structure having a fully depleted porous layer, according to an embodiment described herein. The layered structure 100 may include a starting material layer 102, on which a fully depleted porous layer 104 is formed. According to an aspect of this embodiment, the layered structure includes a first band gap, Eg1, of the fully depleted porous layer and a second band gap, Eg2, of the starting material. The relationship between the band gap of the fully depleted porous layer (Eg1) and the band gap of the starting material (Eg2) satisfies the following formula: Eg1>Eg2. Stated another way, the first band gap, Eg1, of the fully depleted porous layer is greater than the second band gap, Eg2, of the starting material.

In some embodiments, the fully depleted porous layer is elementally identical to the starting material. That is, the chemical elements in the starting material are identical to the chemical elements in the fully depleted porous layer of the layered structure.

During the process of forming the layered structure having the fully depleted porous layer 104 over the starting material layer 102, a layer is formed on top of the starting material that includes a number of pores with each of the pores having a region around it from which all free carriers have been removed. Such pores are formed by passing an electrolyzing current through the starting material from a cathode to an anode. Such process employs a current density of 5-50 mA/cm2 and the etch duration is for approximately 10 seconds to 15 minutes. After passing the electrolyzing current through the starting material, a fully depleted porous layer is formed over the starting material. In the process of forming the layered structure, the fully depleted porous layer is tuned so that the formed fully depleted porous layer may have a resistivity greater than 10,000 ohm-cm, while minimizing the loss of the thermal conductivity of the layered structure by minimizing the number of pores formed in the layer.

According to some embodiments, the layered structure may be tuned by employing a starting material with a resistivity in the range of 0.1 to 10 ohm-cm, such that all or a portion of the starting material can be converted into a fully depleted porous layer with high resistivity and low porosity that will deliver excellent resistivity performance while minimizing the loss of thermal conductivity of the original starting material. In some aspects of this embodiment, the thermal conductivity of the layered structure is at least equal to 3 watts per meter-Kelvin (W/mK).

Figure 37:
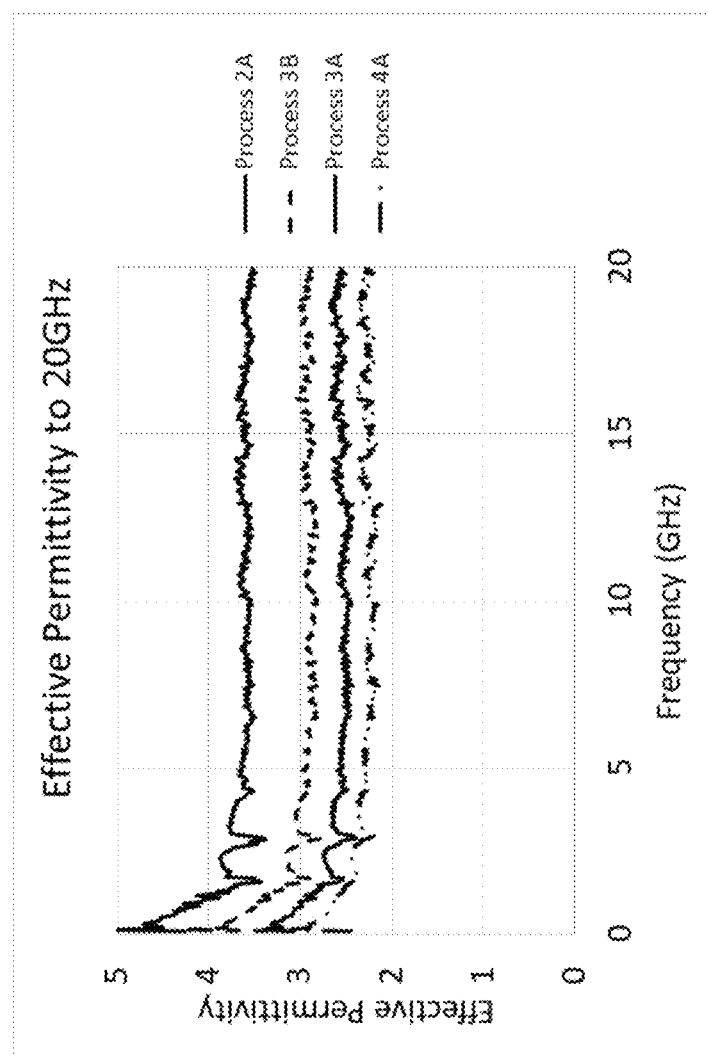
FIG. 37 shows a diagram of effective permittivity vs. frequency for various examples of the layered structure, in accordance with some embodiments of the present disclosure.

According to such a configuration, by carefully tuning the resistivity of a starting material, all or a portion of the starting material can be converted into a layer with resistivity greater than 10,000 ohm-cm and low porosity that will deliver excellent performance while improving the permittivity of the layered structure. In some aspects of this embodiment, the permittivity for the layered structure is in a range of approximately 2 to 4 farads per meter, as shown in FIG. 37.

According to another embodiment, the fully depleted porous layer has a thickness between 10 and 20 μm and a resistivity greater than 10,000 ohm-cm.

Figure 2:
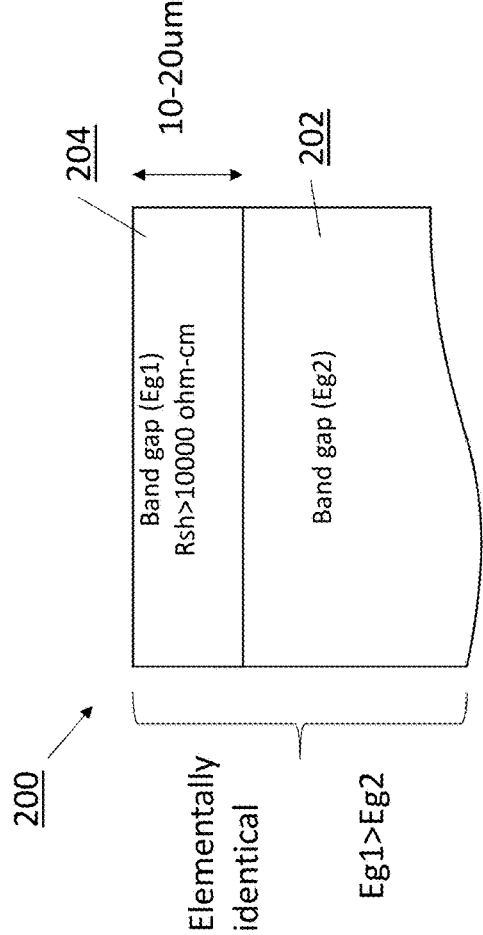
FIG. 2 shows an example of a layered structure having a fully depleted porous layer formed over a starting material, where the resistivity of the fully depleted porous layer is greater than 10,000 ohm-cm, in accordance with some embodiments of the present disclosure.

FIG. 2 shows an example of a layered structure 200 having a fully depleted porous layer, according to an embodiment described herein. The layered structure 200 may include a starting material layer 202, on which a fully depleted porous layer 204 is formed. According to an aspect of this embodiment, the layered structure includes a first band gap, Eg1, of the fully depleted porous layer 204 and a second band gap, Eg2, of the starting material 202. The relationship between the band gap of the fully depleted porous layer 204 and the starting material 202 satisfies the formula, Eg1>Eg2. Stated another way, the first band gap, Eg1, of the fully depleted porous layer 204 is greater than the second band gap, Eg2, of the starting material 102. The fully depleted porous layer 204 has a thickness between 10 and 20 μm.

Figure 3:
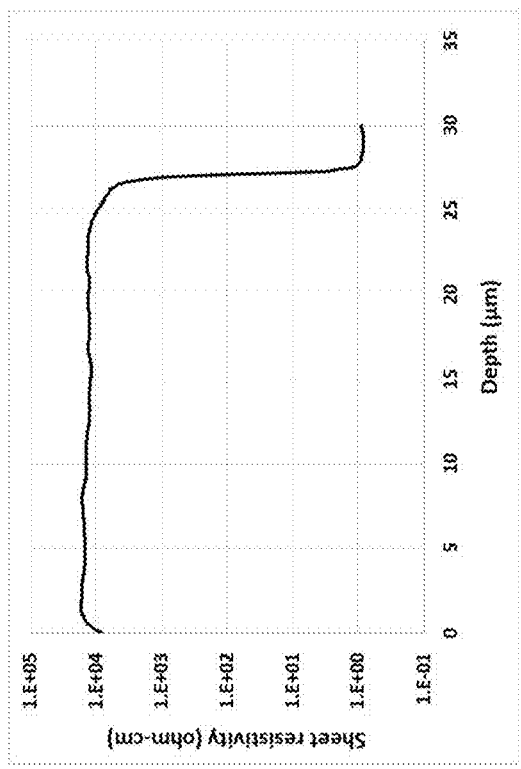
FIG. 3 shows a diagram of sheet resistivity vs. depth for a layered structure similar to the structure shown in FIG. 2, in accordance with some embodiments of the present disclosure.

FIG. 3 shows a diagram of sheet resistivity vs. depth for the layered structure shown in FIG. 2, according to embodiments described herein. In the diagram shown in FIG. 3, the sheet resistivity of the layered structure with the fully depleted porous layer is plotted against the depth of the layered structure. In the layered structure with the fully depleted porous layer, the sheet resistivity is greater than 10000 ohm-cm between a thickness of 0.1 μm and a thickness of 26 μm. The layered structure may be tuned, such that the starting material 202 having a resistivity of 0.1 to 10 ohm-cm is converted to a fully depleted porous layer 204 with a sheet resistivity greater the 10000 ohm-cm. The aforementioned configuration permits an increase in resistivity of the fully depleted porous layer while minimizing the loss of the thermal conductivity to facilitate improved devices.

According to some embodiments, various starting materials may be used in the layered structure.

FIGS. 4-9 show various examples of a layered structure having a fully depleted porous layer with various starting materials, according to embodiments described herein. In the example shown in FIG. 4, a starting material 302 having a resistivity of 0.1-10 ohm-cm is employed with a fully depleted porous layer 304 formed over the starting material 302. Utilizing a starting material with resistivity of 0.1-10 ohm-cm permits for the efficient and cost-effective way of manufacturing the layered structure.

Figure 5:
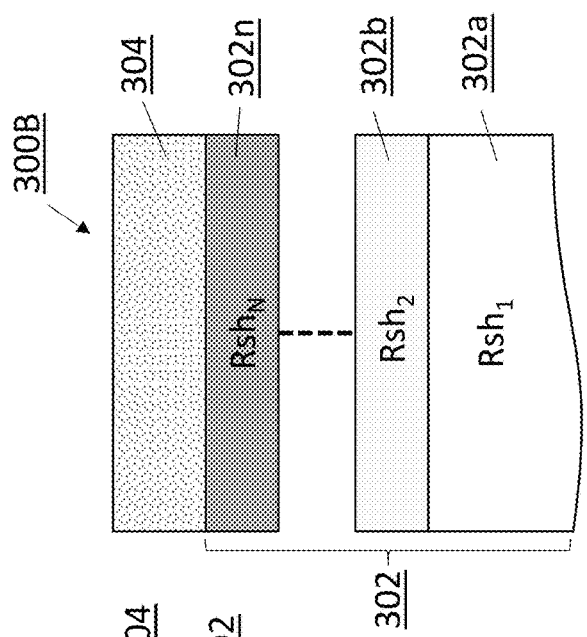
Figure 4:
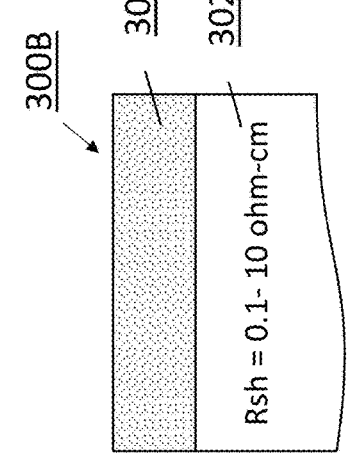

In the example shown in FIG. 5, the starting material 302 can include a plurality of sublayers of the starting material. The starting material includes a first sublayer 302a of the starting material having a first resistivity, $Rsh_1$ and a second sublayer 302b of the starting material having a second resistivity, $Rsh_2$ over the first sublayer 302a. Further, according to an aspect of this configuration, the starting material 302 may include a plurality of sublayers between the second sublayer 302b and a nth sublayer 302n, which are stacked vertically, where n represents a whole number. The nth sublayer 302n can be characterized by a resistivity of $Rsh_n$. The layered structure may have an interface between starting material layer 302 and fully depleted porous layer 304. This interface may be between the nth sublayer 302n of the starting material 302 and an adjacent layer (not shown). There may be additional layers between the starting material 302 and the fully depleted porous layer 304.

Figure 6:
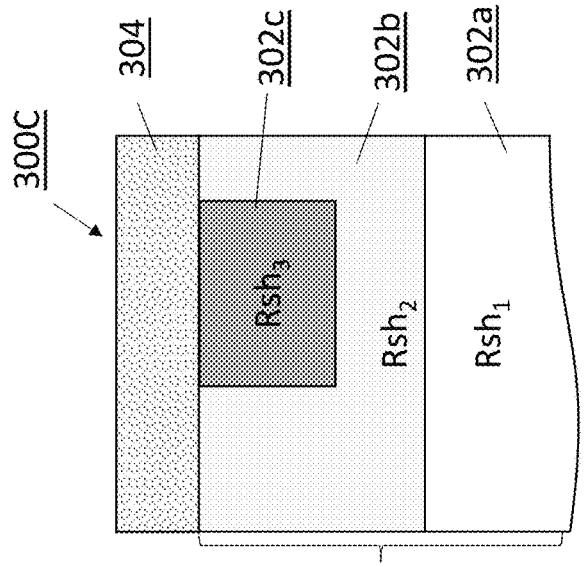
FIGS. 4-9 show various examples of a layered structure having a fully depleted porous layer with various starting materials, in accordance with some embodiments of the present disclosure.

In the example shown in FIG. 6, the starting material 302 can include a plurality of sublayers of the starting material. The starting material includes a first sublayer 302a of the starting material having a first resistivity, $Rsh_1$ and a second sublayer 302b of the starting material having a second resistivity, $Rsh_2$ stacked vertically over the first sublayer 302a. Further, according to an aspect of this configuration, the starting material 302 may include a third sublayer 302c with a third resistivity $Rsh_3$. The third sublayer 302c being dispose within the second sublayer 302b, with a surface of the third sublayer 302c being disposed at the surface of the second sublayer 302b. The third sublayer 302c may have an interface with the fully depleted porous layer 104. This interface may be between the starting material 302c and an adjacent layer (not shown). There may be additional layers between the starting material 302c and the fully depleted porous layer 304.

Figure 7:
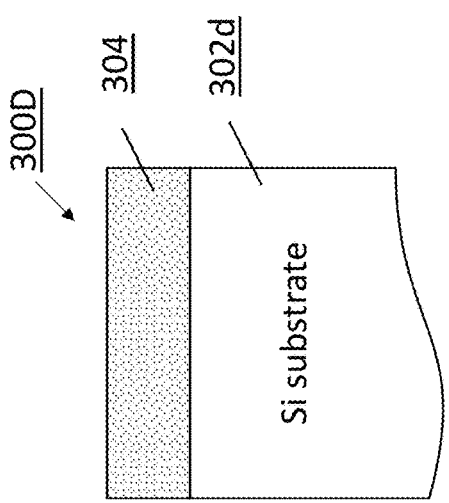

In the example shown in FIG. 7, the starting material 302d is a silicon substrate. The layered structure 300E may have an interface between starting material layer 302d and fully depleted porous layer 304. This interface may be between the starting material and an adjacent layer (not shown).

There may be additional layers between the starting material 302 and the fully depleted porous layer 304.

Figure 8:
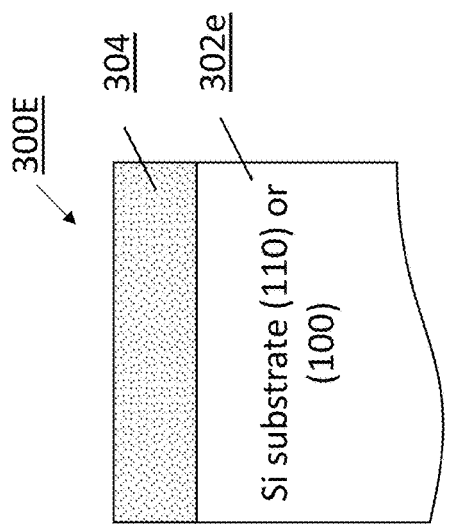

In the example shown in FIG. 8, the starting material 302e may include a silicon substrate. The silicon substrate may include a particular crystal orientation, such as <110> or <100>. The layered structure 300E may have an interface between layers that is an abrupt rotation in crystal orientation between <100> orientation and a <110> orientation. Alternatively, the layered structure may have an interface between layers that includes a silicon substrate 302e having a <100> orientation and a fully depleted porous layer 304 having a <100> orientation formed over the silicon substrate 302e. This interface may be between the silicon substrate 302e and an adjacent layer (not shown). This interface may be between the silicon substrate 302e and the fully depleted porous layer 304. There may be additional layers between the silicon substrate 302e and the fully depleted porous layer 304.

Figure 9:
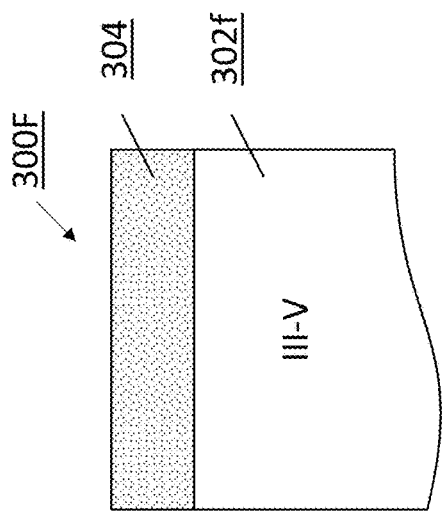

In the example shown in FIG. 9, the starting material 302f may include a group III-V alloy. The group III-V alloy may include a particular orientation, such as <110> or <100>. The layered structure 300F may have an interface between layers that is an abrupt rotation in crystal orientation between <100> orientation and a <110> orientation. Alternatively, the layered structure may have an interface between layers that includes the group III-V alloy 302f having a <100> orientation and the fully depleted porous layer 304 having a <100> orientation formed over the group III-V alloy 302f. This interface may be between the group III-V alloy 302f and an adjacent layer (not shown). This interface may be between the group III-V alloy 302f and the fully depleted porous layer 304. There may be additional layers between the group III-V alloy 302f and the fully depleted porous layer 304.

According to another embodiment, the fully depleted porous layer may include sublayers of periodically alternating sublayers. The periodically alternating sublayers may include sublayers with two or more porosities. In some embodiments, the two alternating porosities may be a first porosity and a second porosity. In some embodiments, the two alternating porosities may be a high porosity and a low porosity. Another aspect of this embodiment, the fully depleted porous layer may include three or more sublayers, with each sublayer having a different porosity. According to such a configuration, the sublayers with different porosities may be stacked vertically over the starting material with the porosity gradually increasing from one end of the fully depleted porous layer to the opposite end of the fully depleted porous layer.

FIGS. 10-13 show various examples of a layered structure having a fully depleted porous layer of at least two different porosities, according to embodiments described herein. In the example shown in FIG. 10, the fully depleted porous layer includes a first sublayer 404a of the fully depleted porous layer with a first porosity P1, over the starting material 402, and a second sublayer 404b of the fully depleted porous layer 404 with a second porosity P2 vertically stacked over the first sublayer of the fully depleted porous layer 404.

In the example shown in FIG. 11, the fully depleted porous layer includes a first sublayer 404b of the fully depleted porous layer 404 with a first porosity P2, covering a first region over the starting material 402, and a second sublayer 404a of the fully depleted porous layer 404 with a second porosity P1 covering a second region over the starting material 402 vertically stacked over the first sublayer 404b of the fully depleted porous layer 404. According to this configuration of this embodiment, the first sublayer and the second sublayer are adjacent to each other and may include an interface between the first sublayer and the second sublayer. According to another aspect of this embodiment, there may be a layer between the first sublayer and second sublayer that acts as a transition layer.

In the example shown in FIG. 12, the fully depleted porous layer includes a first sublayer 404a of the fully depleted porous layer with a first porosity P1, covering a first region over the starting material 402, and a second sublayer 404b of the fully depleted porous layer 404 with a second porosity P2 covering a second region over the starting material 402. The first sublayer 404a and the second sublayer 404b being disposed over the starting material 402 and adjacent to each other in the horizontal direction. According to this configuration of this embodiment, the first sublayer and the second sublayer are adjacent to each other and may include an interface between the first sublayer and the second sublayer. According to another aspect of this embodiment, there may be a layer between the first sublayer and second sublayer that acts as a transition layer.

In the example shown in FIG. 13, the layered structure includes a top layer having variety of regions. The top layer includes a fully depleted porous layer at one side and a starting material layer 402 that has not been depleted adjacent to the fully depleted porous layer. For example, the top layer includes a fully depleted porous layer 404 on one side of the layered structure, a starting material layer 402 adjacent to the fully depleted porous layer and a fully depleted porous layer at another side of the top layer. According to this configuration of this embodiment, the first sublayer and the second sublayer are adjacent to each other and may include an interface between the first sublayer and the second sublayer. According to another aspect of this embodiment, there may be a layer between the first sublayer and second sublayer that acts as a transition layer.

Figure 14:
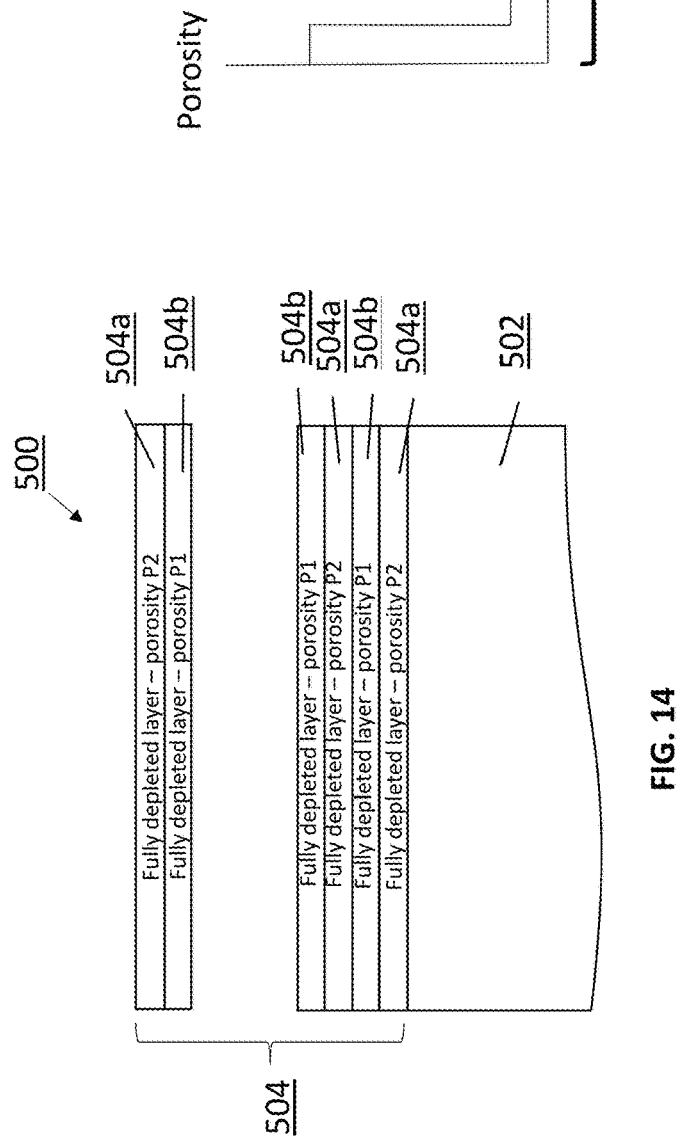
FIG. 14 shows an example of a layered structure including a fully depleted porous layer with periodically alternating sublayers formed over the starting material, in accordance with some embodiments of the present disclosure.

FIG. 14 shows an example of a layered structure 500 including a fully depleted porous layer 504 with periodically alternating sublayers (504a and 504b) formed over a starting material 502. The periodically alternating sublayers are stacked vertically over the starting material layer 502 and are fully depleted. The periodically alternating sublayers 504 may include a plurality of sublayers including a sublayer having a first porosity 504a disposed over the starting material 502, a sublayer having a second porosity 504b over the sublayer having the first porosity 504a. According to this configuration of the embodiment, the sublayer having the first porosity and the sublayer having a second porosity can repeat for an n number of times. In some embodiments, the fully depleted porous layer 504 may include between 10 and 20 sublayers that are periodically alternating sublayers. The layered structure 500 may be tuned by varying the periodically alternating sublayers of the fully depleted porous layer 504, which results in an increase in resistivity of the fully depleted porous layer while minimizing the loss of the thermal conductivity of the layered structure 500 to facilitate improved devices.

The foregoing FIGS. 4-14 are merely illustrative of the principles of this disclosure and various modifications may be made by those skilled in the art without departing from the scope of this disclosure. The embodiments described above are presented for purposes of illustration and not of limitation. For example, any combination of starting material layers and fully depleted porous layers may be used in a layered structure in accordance with the present disclosure. In some examples, the starting material of FIG. 4 may be used in combination with configuration of the fully depleted porous layer of FIG. 13. According to such a configuration, the layered structure includes a fully depleted layer and a non-fully depleted layer. In another example, the starting material of FIG. 8 may be used in combination with the fully depleted porous layer of FIG. 11. According to such a configuration, the crystal orientation of the silicone substrate may permit the fully depleted porous layer to form in such a way that the resistivity of the fully depleted porous layer is increased to provide exceptional performance while minimizing the loss of thermal performance of the layered structure.

Figure 15:
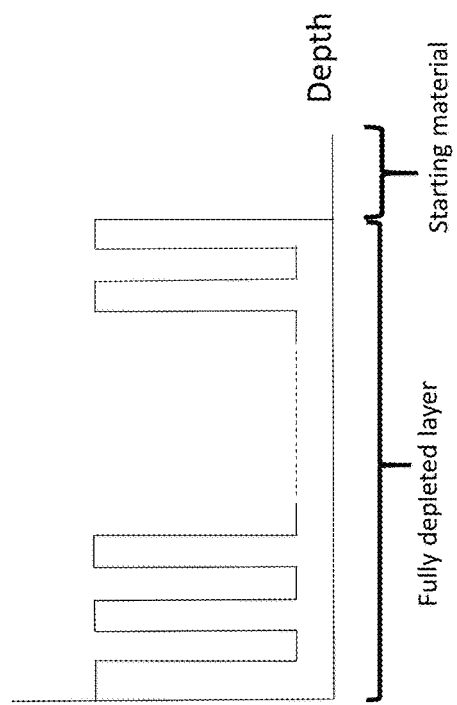
FIG. 15 shows a diagram of porosity vs. depth of a layered structure similar to the structure shown in FIG. 14, in accordance with some embodiments of the present disclosure.

FIG. 15 shows a diagram of porosity vs. depth for a layered structure similar to the structure shown in FIG. 14, according to embodiments described herein. In the diagram shown in FIG. 15, a porosity of the layered structure is plotted against the depth of the layered structure. In the layered structure, a periodically alternating porosity is observed for the fully depleted porous layer 504 starting at the surface of the fully depleted porous layer 504 and up to the interface between the fully depleted porous layer 504 and the starting material 502, and no porosity is observed for the starting material.

Figure 16:
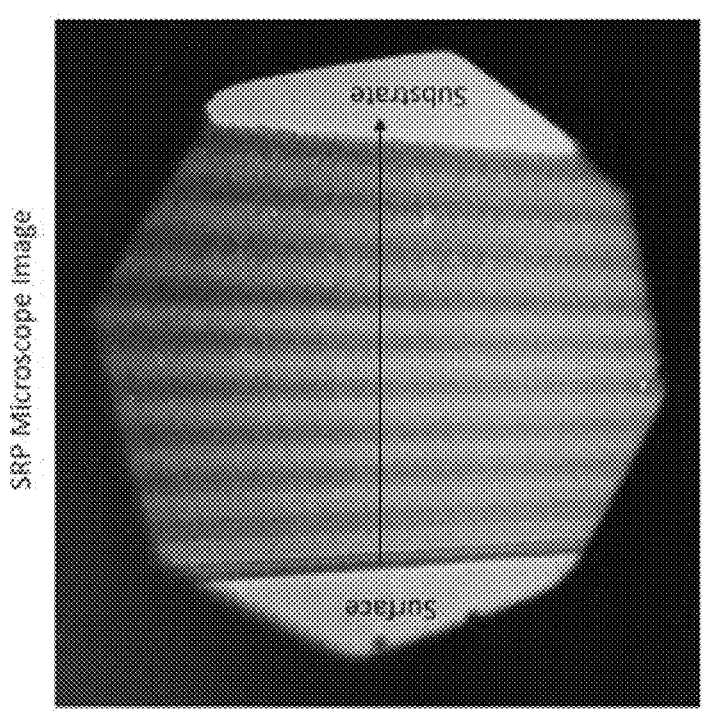
FIG. 16 shows an image of a layered structure having a fully depleted porous layer with periodically alternating sublayers formed over a substrate, in accordance with some embodiments of the present disclosure.

FIG. 16 shows an image of a layered structure having a fully depleted porous layer with periodically alternating sublayers formed over a substrate, according to embodiments described herein. In the image shown in FIG. 16, the fully depleted porous layer includes periodically alternating sublayers with alternating porosities over the substrate (starting material).

In some embodiments, the fully depleted porous layer may include a plurality of sublayers stacked vertically. In some aspects of this embodiment, the plurality of sublayers may include a graded porosity, such that a sublayer with a high porosity is disposed at a surface of the fully depleted porous layer, and a sublayer with a lower porosity is disposed at an interface of the fully depleted porous layer and the starting material.

In some embodiments, the fully depleted porous layer may include a plurality of sublayers stacked vertically. In some aspects of this embodiment, the plurality of sublayers may include a graded porosity. The graded porosity may include a sublayer with a low porosity at one end of the fully depleted porous layer and a sublayer with a high porosity at an opposite end of the fully depleted porous layer. According to another embodiment, the sublayer with the high porosity may be disposed at an interface of the fully depleted porous layer and the starting material, and the sublayer with the low porosity may be disposed at a surface of the fully depleted porous layer.

Figure 17:
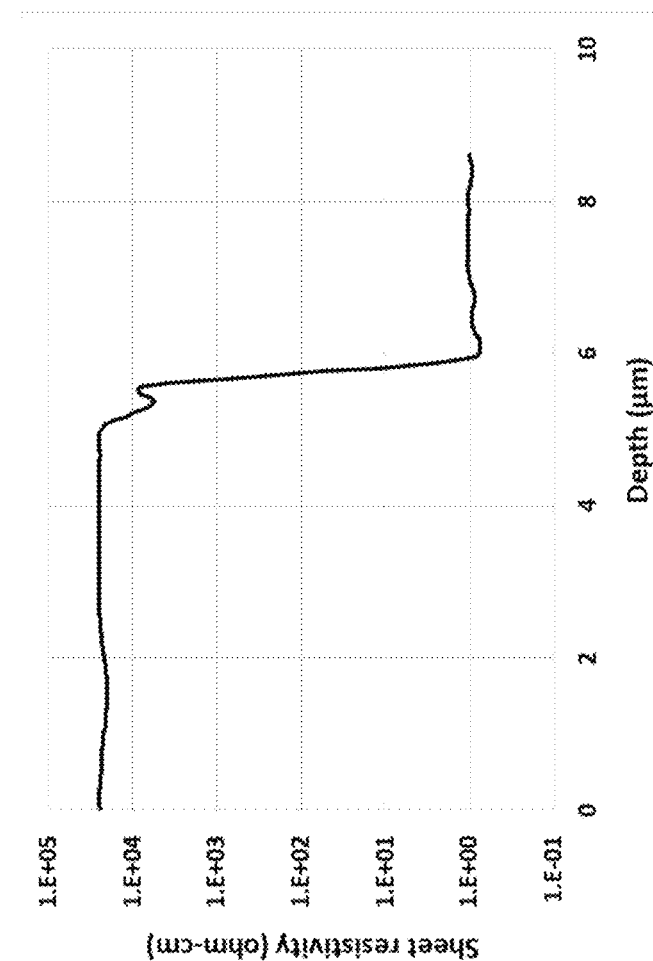
FIG. 17 shows a diagram of sheet resistivity vs. depth for a layered structure similar to the structure shown in FIG. 16, in accordance with some embodiments of the present disclosure.

FIG. 17 shows a diagram of sheet resistivity vs. depth for a layered structure similar to the structure shown in FIG. 16, according to embodiments described herein. In the diagram shown in FIG. 17, the sheet resistivity of the layered structure with the fully depleted porous layer is plotted against the depth of the layered structure. In the layered structure with the fully depleted porous layer, the sheet resistivity is greater than 10000 ohm-cm between a thickness of 0.1 µm and a thickness of 5.16 µm, as shown in Table 1. The layered structure may be tuned, such that the starting material having a resistivity of 0.1 to 10 ohm-cm is converted to a fully depleted porous layer with a sheet resistivity greater the 10000 ohm-cm. The aforementioned configuration permits an increase in resistivity of the fully depleted porous layer while minimizing the loss of the thermal conductivity to facilitate improved devices.

TABLE 1

Example Sheet Resistivity at varying depths of an example layered structure

| SRP Depth (µm) | SRP Resistivity (ohm-cm) |
| --- | --- |
| 0.00 | 24,633 |
| 0.10 | 24,747 |
| 0.19 | 24,788 |
| 0.30 | 24,448 |
| 0.42 | 23,986 |
| 0.49 | 23,684 |
| 0.56 | 23,557 |
| 0.60 | 23,433 |
| 0.71 | 23,186 |
| 0.80 | 22,926 |
| 0.91 | 22,616 |
| 0.99 | 22,199 |
| 1.29 | 20,579 |
| 1.40 | 20,512 |
| 1.60 | 20,381 |
| 1.91 | 21,199 |
| 2.10 | 22,652 |
| 2.51 | 24,529 |
| 3.01 | 24,834 |
| 3.40 | 24,861 |
| 3.70 | 24,884 |
| 4.01 | 24,909 |
| 4.51 | 24,892 |
| 5.01 | 23,515 |
| 5.16 | 12,371 |

As shown in Table 1, the sheet resistivity of the layered structure is greater than 10000 ohm-cm from a depth of 0.0 µm (e.g., surface of the layered structure) to a depth of 5.16 µm. For example, the layered structure is fully depleted and may provide a sheet resistivity greater than 20000 ohm-cm from a depth of 0.0 µm (e.g., surface of the layered structure) to a depth of 5.16 µm.

According to the aforementioned embodiments, the layered structure can be obtained with minimal loss of thermal conductivity while the resistance is increased exponentially. The layered structure as described herein, may be tuned to adjust the electrical and thermal properties. Specifically, the thermal conductivity of the layered structure is at least equal to 3 W/m-K.

Additionally or in the alternative, according to some embodiments, the fully depleted porous layer may be lattice matched to the starting material along one crystallographic direction but may be mismatched along a second crystallographic direction. Thus, throughout the layered structure, the lattice strain between the fully depleted porous layer and the starting material layer is reduced through an interface between the fully depleted porous layer and the starting material layer.

In some embodiments, the periodically alternating sublayers may form an acoustic reflector. In some embodiments, the periodically alternating sublayers may form a coherent phonon structure.

According to some embodiments, the layered structure may include an epitaxial layer disposed over the fully depleted porous layer. According to some embodiments, the starting material layer may include a silicon substrate with fully depleted porous layer formed over the starting material layer. The starting material layer and the fully depleted porous layer being elementally identical. An epitaxial layer may be formed over the fully depleted porous layer. According to some embodiments, the layered structure includes a silicon starting material layer, the fully depleted porous layer that is elementally identical to the silicon starting material layer and the epitaxial layer formed over the fully depleted porous layer.

FIGS. 18-21 show various examples of a layered structure with an epitaxial layer formed over the fully depleted porous layer, according to embodiments described herein. In the example shown in FIG. 18, the layered structure 700A includes a starting material layer 702, a fully depleted porous layer 704 over the starting material and an epitaxial layer 706 over the fully depleted porous layer 704.

Figure 19:
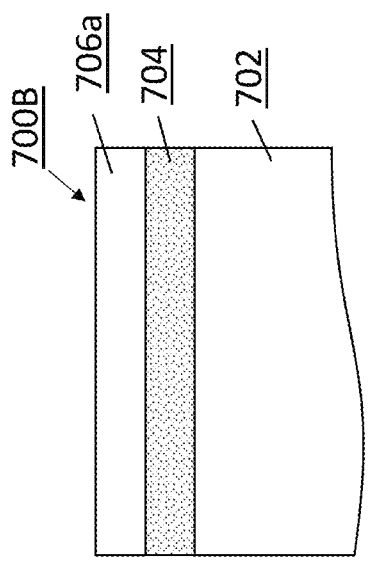
FIGS. 18-21 show various examples of a layered structure with an epitaxial layer grown on top of the fully depleted porous layer, in accordance with some embodiments of the present disclosure.

In the example shown in FIG. 19, the layered structure 700B includes a starting material layer 702, a fully depleted porous layer 704 formed over the starting material layer 702 and a silicon semiconductor layer 706 over the fully depleted porous layer 704. For example, in the layered structure 700B, the epitaxial layer formed over the fully depleted porous layer is a silicon semiconductor layer 706. In some embodiments, the layer structure may include the starting material comprising a silicon substrate, and the epitaxial layer comprising a silicon layer. The fully depleted porous layer may include a silicon substrate as a lower sublayer, a fully depleted silicon layer sandwiched between the lower sublayer and a top sublayer of silicon substrate, which is formed by surface sealing the fully depleted porous layer. According to this embodiment, a semiconductor device may be epitaxially grown over the fully depleted porous layer. In some embodiments, the epitaxial layer is a silicon semiconductor layer. According to another embodiment, the epitaxial layer is a layer comprising one or more of the following InP, cREO, AlGaInN, and RE-III-N compounds. In some embodiments, the semiconductor layer includes silicon and one or more of the following InP, cREO, Mo, AlGaInN, RE-III-N compounds and other metal compounds. According to such a configuration, the layered structure can maintain the thermal properties of the starting material, while increasing the resistivity of the fully depleted porous layer to facilitate improved semiconductor devices.

Figure 20:
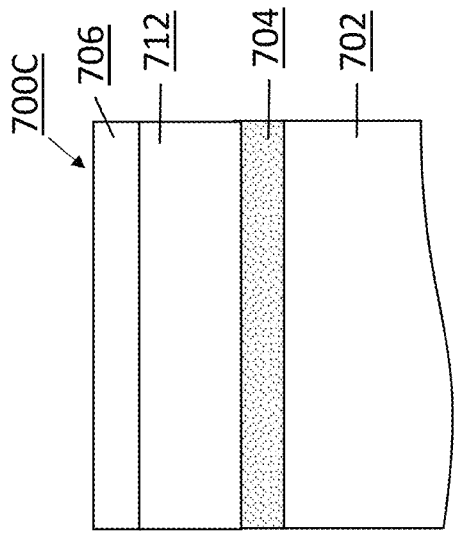

In the example shown in FIG. 20, the layered structure 700C includes a starting material layer 702, a fully depleted porous layer 704 over the starting material, a transitional layer 712 formed over the fully depleted porous layer 704 and an epitaxial layer 706 formed over the transition epitaxial layer 712. The transitional epitaxial layer 712 may be a silicon substrate providing surface sealing of the fully depleted porous layer. Alternatively, the transitional epitaxial layer 712 can be an insulation layer between the fully depleted porous layer and the epitaxial layer 706. According to such a configuration, the layered structure can maintain the thermal properties of the starting material, while increasing the resistivity of the fully depleted porous layer to facilitate improved semiconductor devices.

Figure 21:
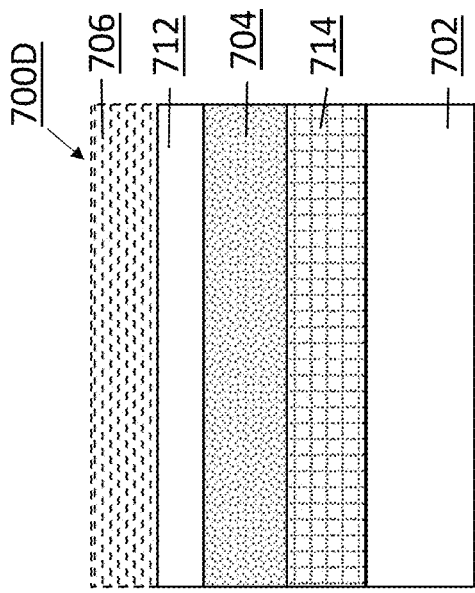
Figure 18:
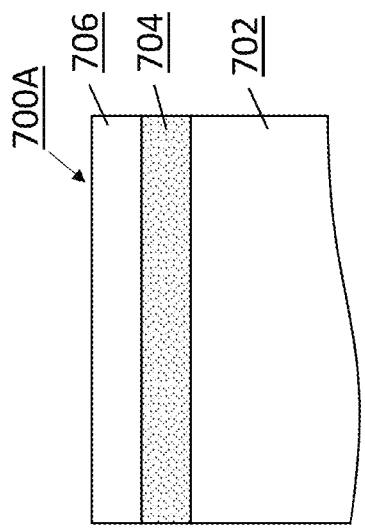

In the example shown in FIG. 21, the layered structure 700D includes a starting material layer 702, a doping layer 714 over the starting material layer, a fully depleted porous layer 704 over the doping layer, a transitional epitaxial layer 712 formed over the fully depleted porous layer 704 and an epitaxial layer 706 over the fully depleted porous layer 704.

In some embodiments, the starting material may be a silicon substrate having a resistivity of 0.1 to 10 ohm-cm. Utilizing such a substrate permits for the efficient and cost-effective way of manufacturing the layered structure. The doping layer 714 includes varying silicon doping concentrations to permit tuning of the layered structure and provide additional thermal insulation to the layered structure as whole. The fully depleted porous layer 704 may include porosity in the range of 5% to 60%. The fully depleted porous layer may have a thickness in the range of 1-50 μm. The transitional epitaxial layer 712 may be a silicon substrate providing surface sealing of the fully depleted porous layer 704. Alternatively, the transitional epitaxial layer 712 can be an insulation layer between the fully depleted porous layer 704 and epitaxial layer formed over the transitional epitaxial layer 712. The transitional epitaxial layer 712 may have a thickness less of than 10 nm. The epitaxial layer 706 may have a thickness in a range of 1 nm to 10,000 nm. According to such a configuration, the layered structure can maintain the thermal properties of the starting material 702, while increasing the resistivity of the fully depleted porous layer to facilitate an improved device. Moreover, this configuration permits the layered structure to avoid the degradation due to loss of thermal insulation of the device with resistivity greater than 10,000 ohm-cm.

Figure 22:
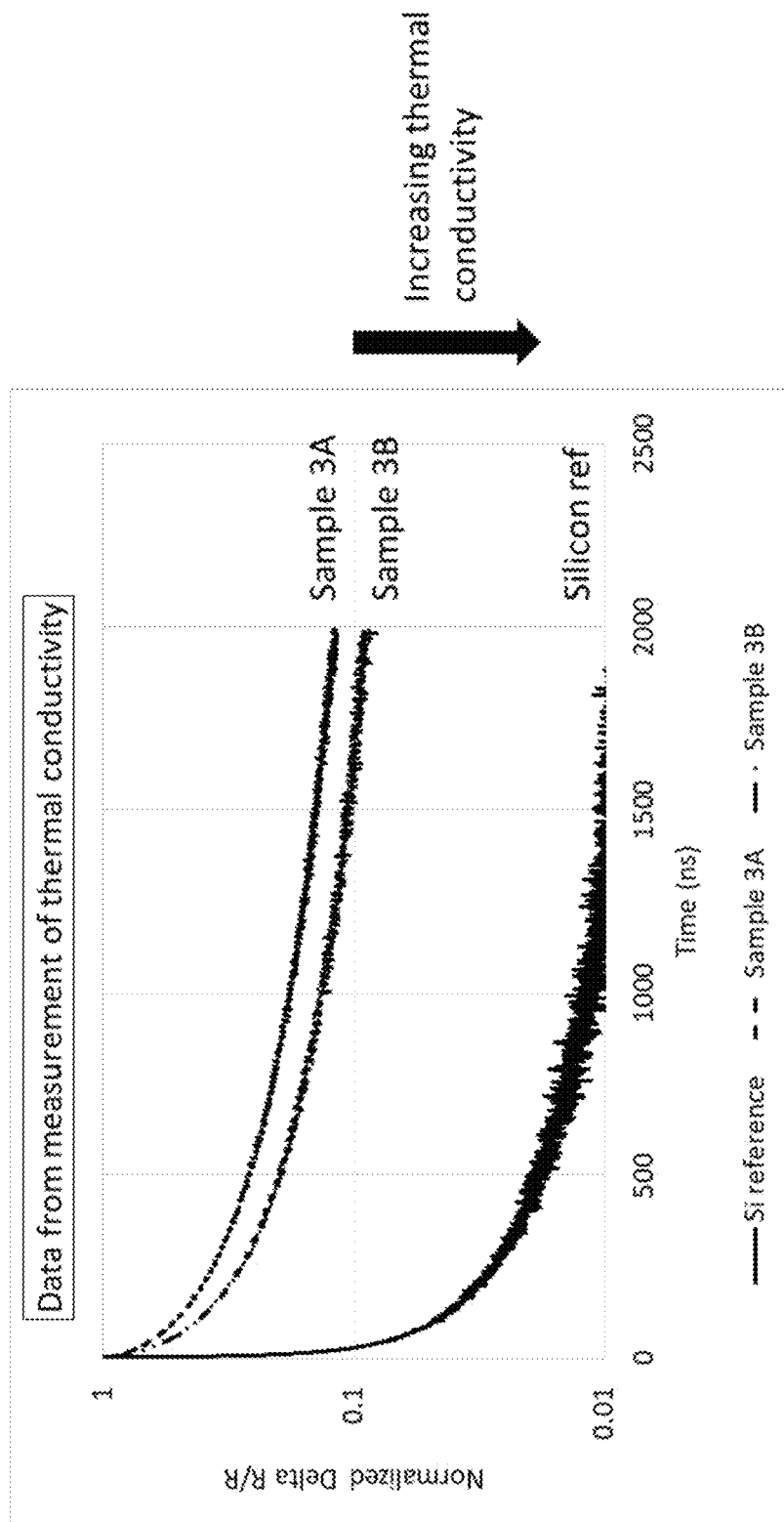
FIG. 22 shows a diagram of experimental data representative of the different thermal conductivities for various examples of a layered structure similar to the structure shown in FIG. 1 and a silicon reference, in accordance with some embodiments of the present disclosure.

FIG. 22 shows a diagram of experimental data representative of the different thermal conductivities for various examples for a layered structure similar to the structure shown in FIG. 1 and a silicon reference, according to embodiments described herein. In the diagram shown in FIG. 22, thermal conductivity is plotted over time for pure silicon, porous silicon and fully depleted silicon. As shown in the FIG. 22, pure silicon starts with a thermal conductivity of approximately 142 W/m K depending on the temperature, while porous silicate (pSi) is approximately 1.5 W/m K. According to the improvements of the present disclosure, the fully depleted porous layer exhibits a thermal conductivity of 3 W/m K. The aforementioned configuration permits an increase in resistivity of the fully depleted porous layer while minimizing the loss of the thermal conductivity to facilitate improved devices.

Figure 23:
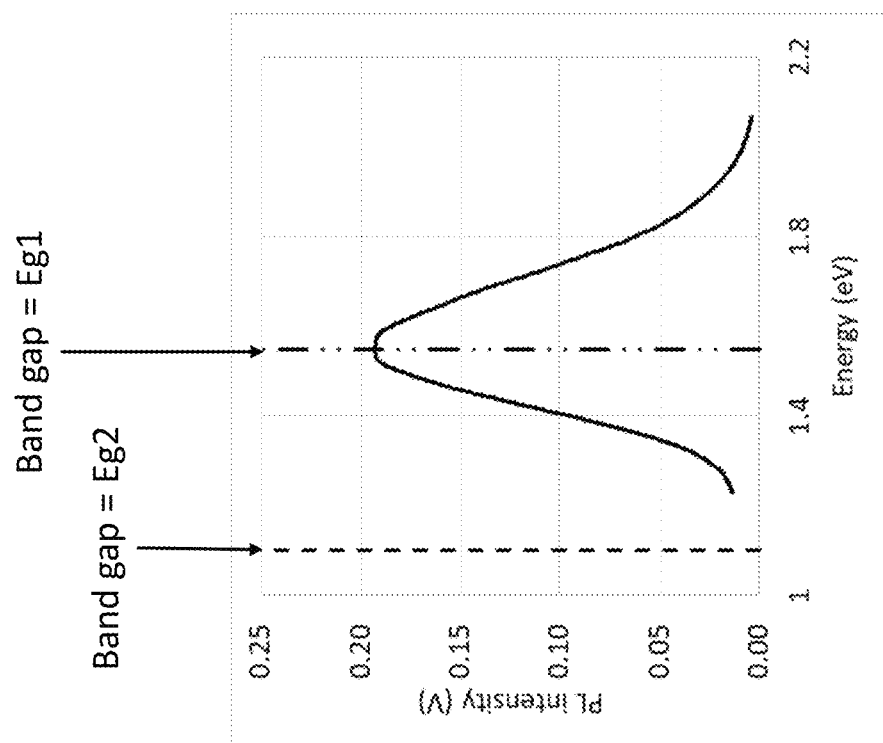
FIG. 23 shows a diagram of photo luminescence vs. energy of the layered structure similar to the structure shown in FIG. 1 having band gap Eg1 and Eg2, in accordance with some embodiments of the present disclosure.

FIG. 23 shows a diagram of photo luminescence vs. energy for a layered structure similar to the structure shown in FIG. 1, according to embodiments described herein. In the diagram shown in FIG. 23, photo luminescence is illustrated for the layered structure as the energy increases, as exemplified by the embodiments of this disclosure. The aforementioned configuration permits an increase in resistivity of the fully depleted porous layer while minimizing the loss of the thermal conductivity to facilitate improved devices.

Figure 25:
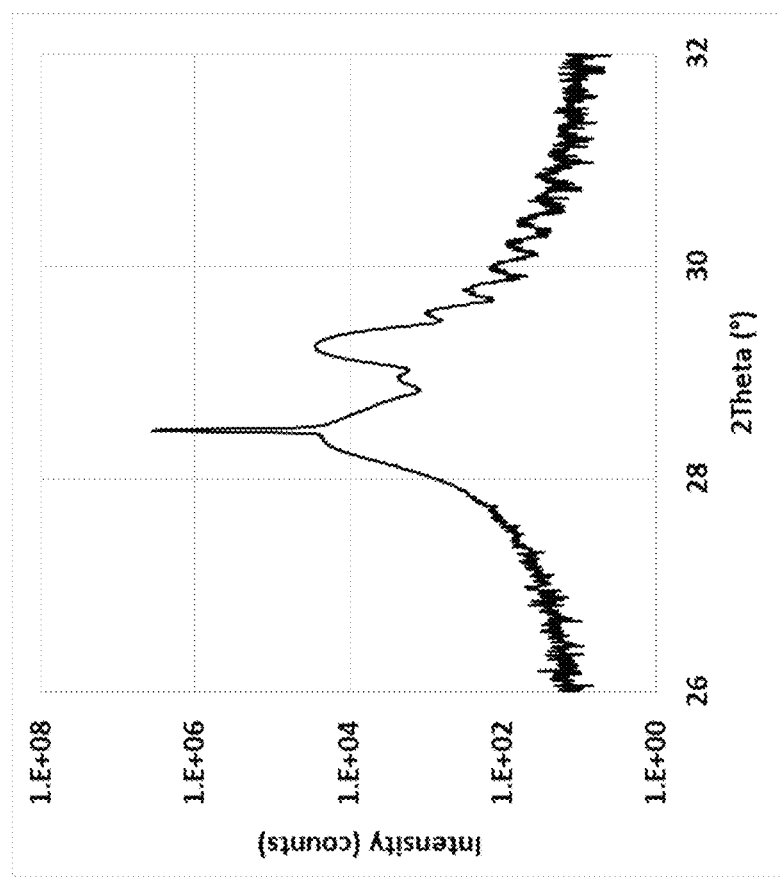
FIGS. 24 and 25 show diagrams of X-ray diffraction of various examples of the layered structure having a fully depleted porous layer, in accordance with some embodiments of the present disclosure.
Figure 24:
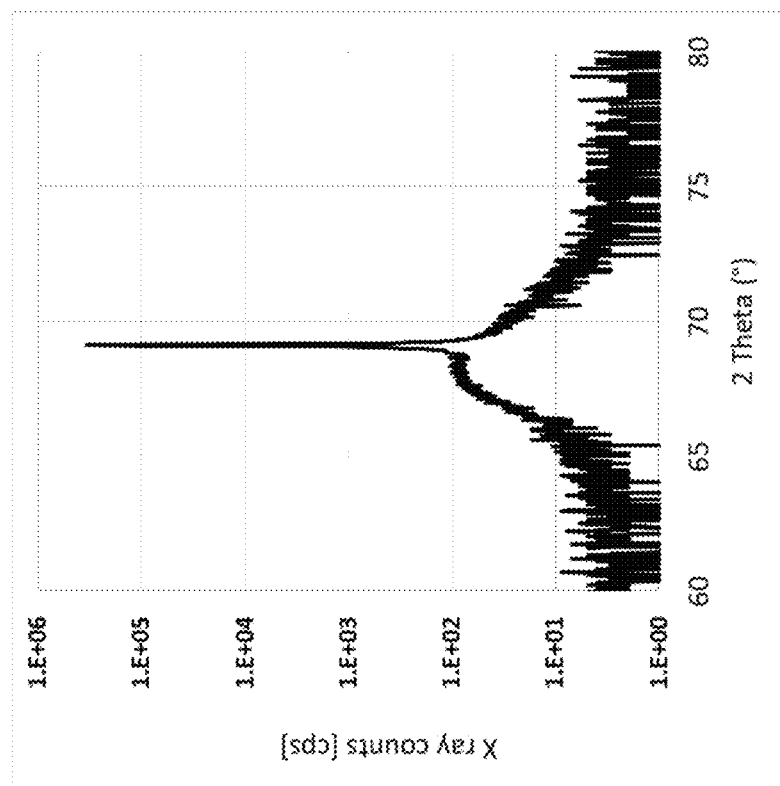

FIGS. 24 and 25 show diagrams of X-ray diffraction of various examples for a layered structure having a fully depleted porous layer, according to embodiments described herein.

Figure 27:
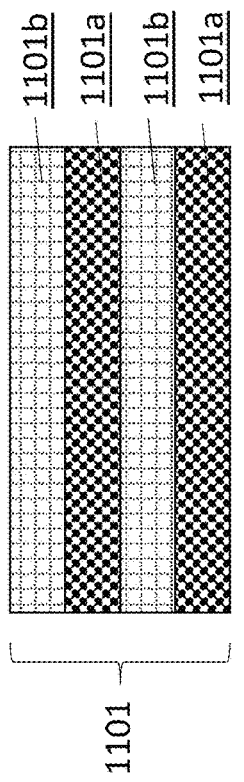
FIGS. 27 and 28 show various examples of the additional porous layer of a layered structure similar to the structure shown in FIG. 26, in accordance with some embodiments of the present disclosure.
Figure 28:
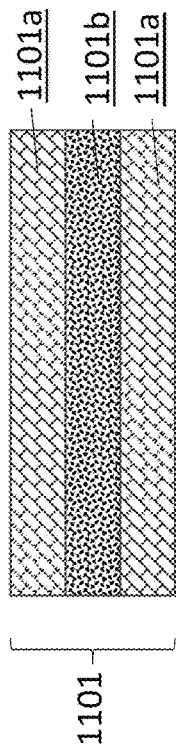
Figure 26:
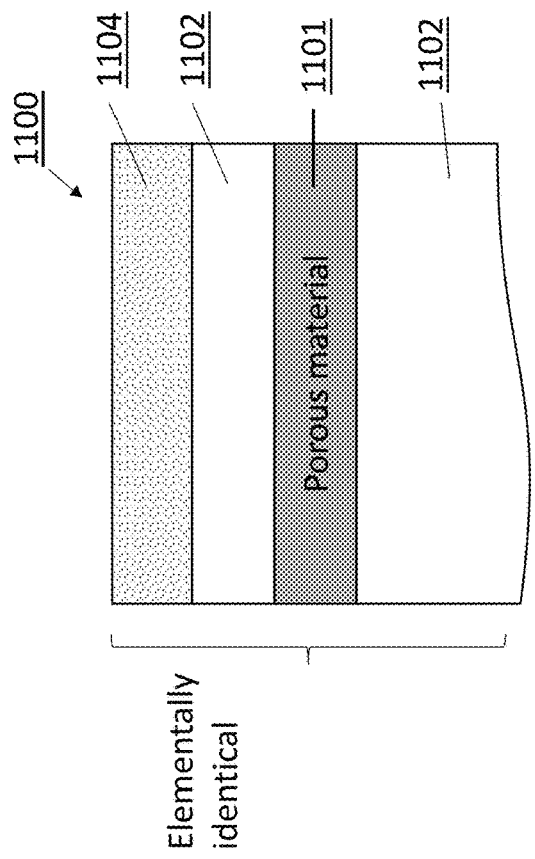
FIG. 26 shows an example of a layered structure with a fully depleted porous layer over a starting material that includes an additional porous layer, in accordance with some embodiments of the present disclosure.

FIGS. 26-28 shows various examples of a layered structure with a porous layer sandwiched between two layers of the starting material, according to embodiments described herein. In the example shown in FIG. 26, the layered structure 1100 includes a starting material layer 1102, a porous material layer 1101 over the starting material, a second layer of starting material 1102 over the porous material layer 1101, and a fully depleted porous layer 1104 over the second layer of starting material.

In the example shown in FIG. 27, the porous material layer 1101 over the starting material 1102 is shown with a variety of sublayers. The porous material layer 1101 may include a plurality of sublayers. The plurality of sublayers may be a high and low porous distributed Bragg reflector (DBR). In some embodiments, the plurality of sublayers may include a first porosity 1101a and a second porosity 1101b that alternate back and forth between the starting material. According to such a configuration, the layered structure can maintain the thermal properties of the starting material, while increasing the resistivity of the fully depleted porous layer to facilitate improved semiconductor devices.

In the example shown in FIG. 28, the porous material layer 1101 sandwiched between the two layers of starting material may be used for wafer cleaving. In such a configuration, the porous material layer may include a buried high porous layer sandwiched between sublayer having a lower porosity. According to such a configuration, the layered structure can maintain the thermal properties of the starting material, while increasing the resistivity of the fully depleted porous layer to facilitate improved devices.

In some embodiments, the layered structure is a layer of a radio-frequency (RF) switch structure.

In some embodiments, the layered structure is a layer of an integrated passive device.

In some embodiments, the layered structure is a layer of a radio-frequency (RF) filter.

Figure 29:
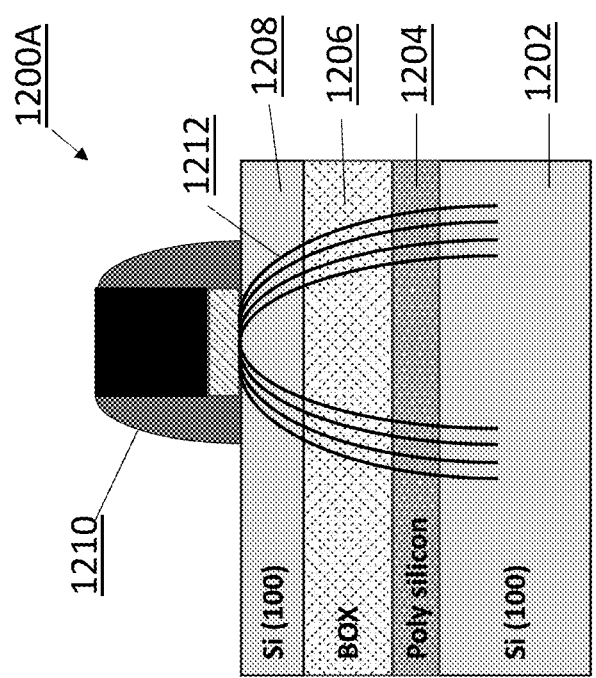
FIG. 29 shows an example of previously known configuration of the layered structure.

FIG. 29 shows an example of a previously known configuration for a layered structure. In the example shown in FIG. 29, the structure includes a silicon layer 1202 with a crystal orientation (100), a poly silicon layer 1204, a transition layer (BOX) 1206, a silicon layer 1208 with a crystal orientation (100) over the transition layer 1206. In addition, a device 1210 may be disposed over the silicon layer 1208. According to such a configuration, the device 1210 may produce radio-frequency field lines 1212 which based on this configuration bleed through the poly silicon layer 1204 and into the substrate layer. This configuration causes significant losses in efficiency.

Figure 30:
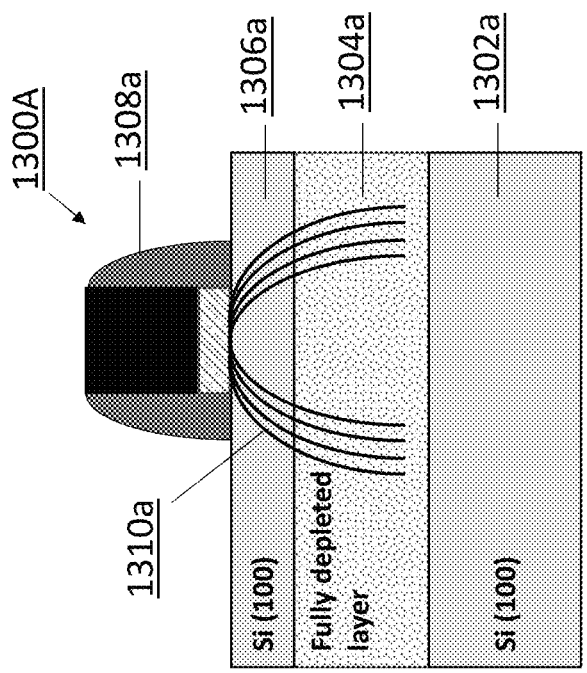
FIG. 30 shows an example of a layered structure with a fully depleted porous layer, in accordance with some embodiments of the present disclosure.

On the other hand, a configuration employing a fully depleted porous layer exhibits exceptional sheet resistivity properties and reduces radio-frequency bleeding to the substrate layer. For example, as shown in FIG. 30, an example of a layered structure with a fully depleted porous layer, according to embodiments described herein. The layered structure shown in FIG. 30 includes a silicon layer 1302a with a crystal orientation (100), a fully depleted porous layer 1304a, a silicon layer 1306a with a crystal orientation (100) over the fully depleted porous layer 1304a. In addition, a device 1308a may be disposed over the silicon layer 1306a. Such a configuration employing a fully depleted porous layer exhibits exceptional sheet resistivity properties and reduces radio-frequency bleeding to the substrate layer.

Figure 31:
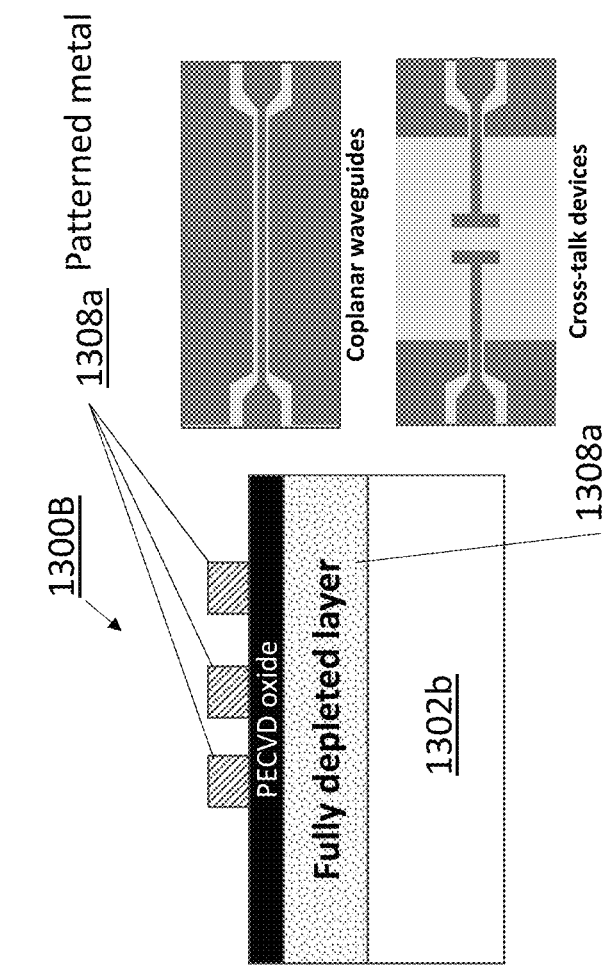
FIG. 31 shows an example of a layered structure with a fully depleted porous layer and an RF switch device over the layered structure, in accordance with some embodiments of the present disclosure.

FIG. 31 shows an example of a layered structure with a fully depleted porous layer and an RF switch device over the layered structure, according to embodiments described herein. In the example shown in FIG. 31 a patterned metal is disposed over an oxide layer formed over the fully depleted porous layer. Such patterned metal may be in the form of a coplanar waveguides or cross-talk devices.

Figure 32:
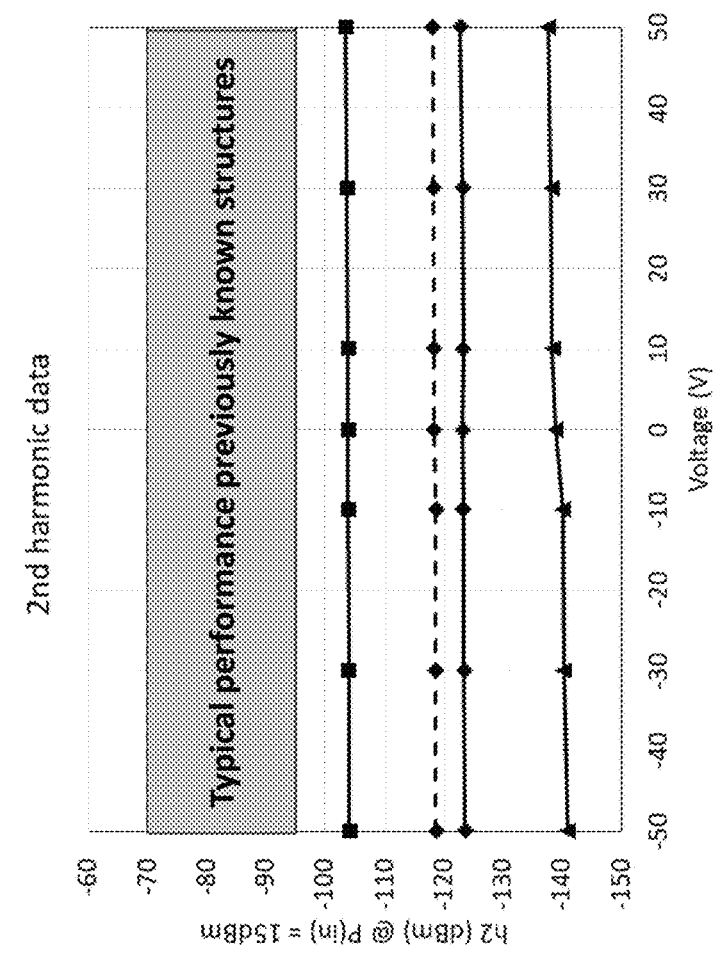
FIG. 32 shows a diagram of second harmonic distortion of a layered structure as compared to previously known structures, in accordance with some embodiments of the present disclosure.

FIG. 32 shows a diagram of second harmonic distortion for a layered structure as compared to a previously known structure, according to embodiments described herein. In the diagram shown in FIG. 32, process 2A, process 3A, 3B and 4A are exemplary layered structures with fully depleted porous layers. Further, as can be seen from the variety of results, the layered structure may be tuned to improve electrical properties while minimizing loss of thermal properties.

Figure 33:
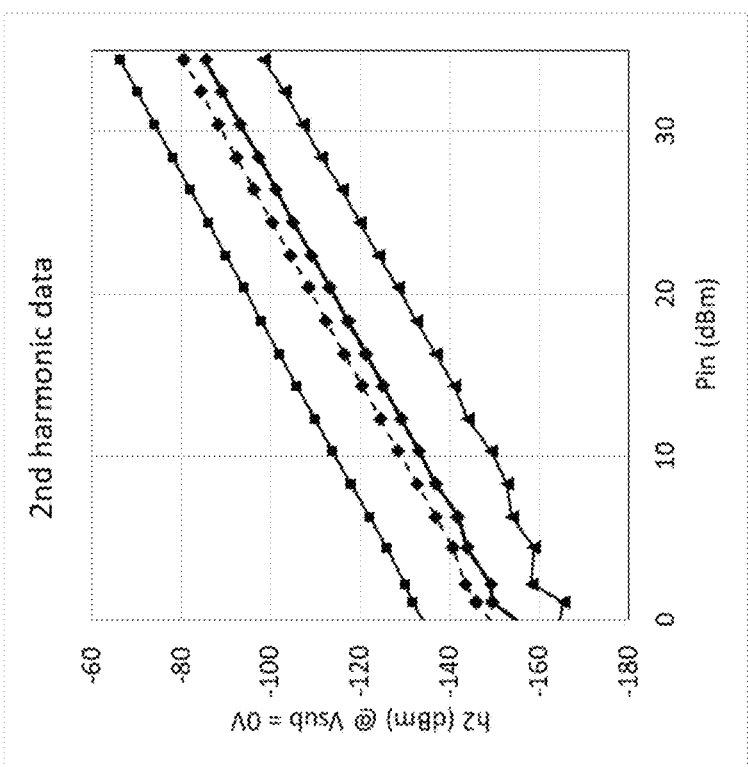
FIG. 33 shows a diagram of second harmonic distortion of a layered structure, in accordance with some embodiments of the present disclosure.

FIG. 33 shows a diagram of second harmonic distortion for a layered structure, according to embodiments described herein.

Figure 34:
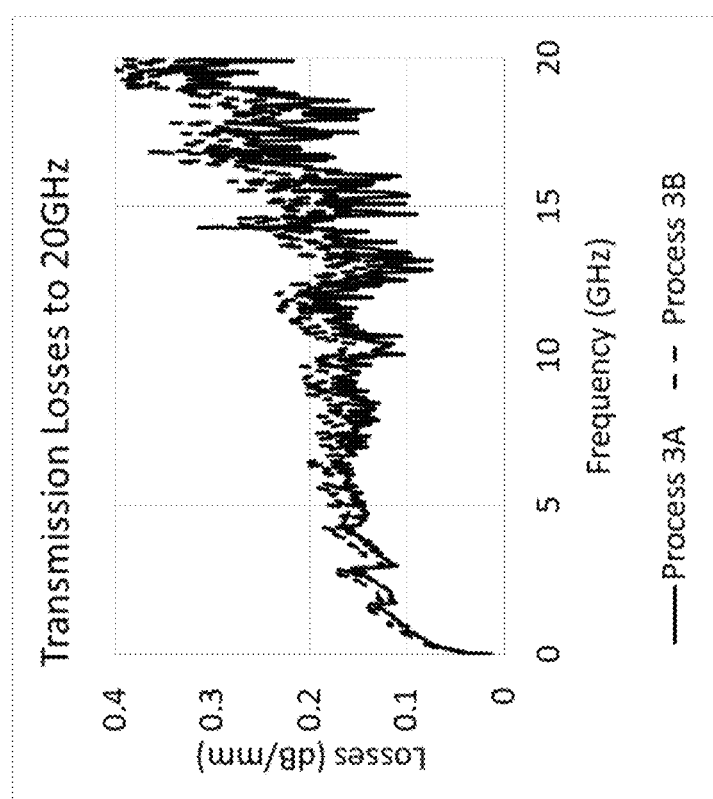
FIG. 34 shows a diagram of transmission losses for frequencies up to 20 GHz for a radio-frequency switch, in accordance with some embodiments of the present disclosure.

FIG. 34 shows a diagram of characteristic transmission losses for frequencies up to 20 GHz for a radio-frequency switch, according to embodiments described herein.

Figure 35:
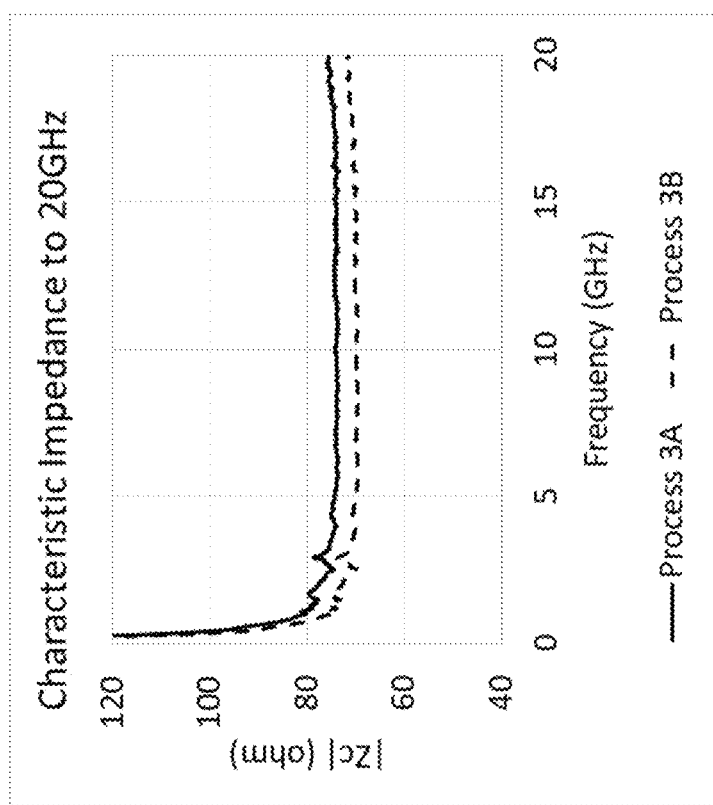
FIG. 35 shows a diagram of characteristic impedance for frequencies up to 20 GHz for a radio-frequency switch, in accordance with some embodiments of the present disclosure.

FIG. 35 shows a diagram of characteristic impedance for frequencies up to 20 GHz for a radio-frequency switch, according to embodiments described herein.

Figure 36:
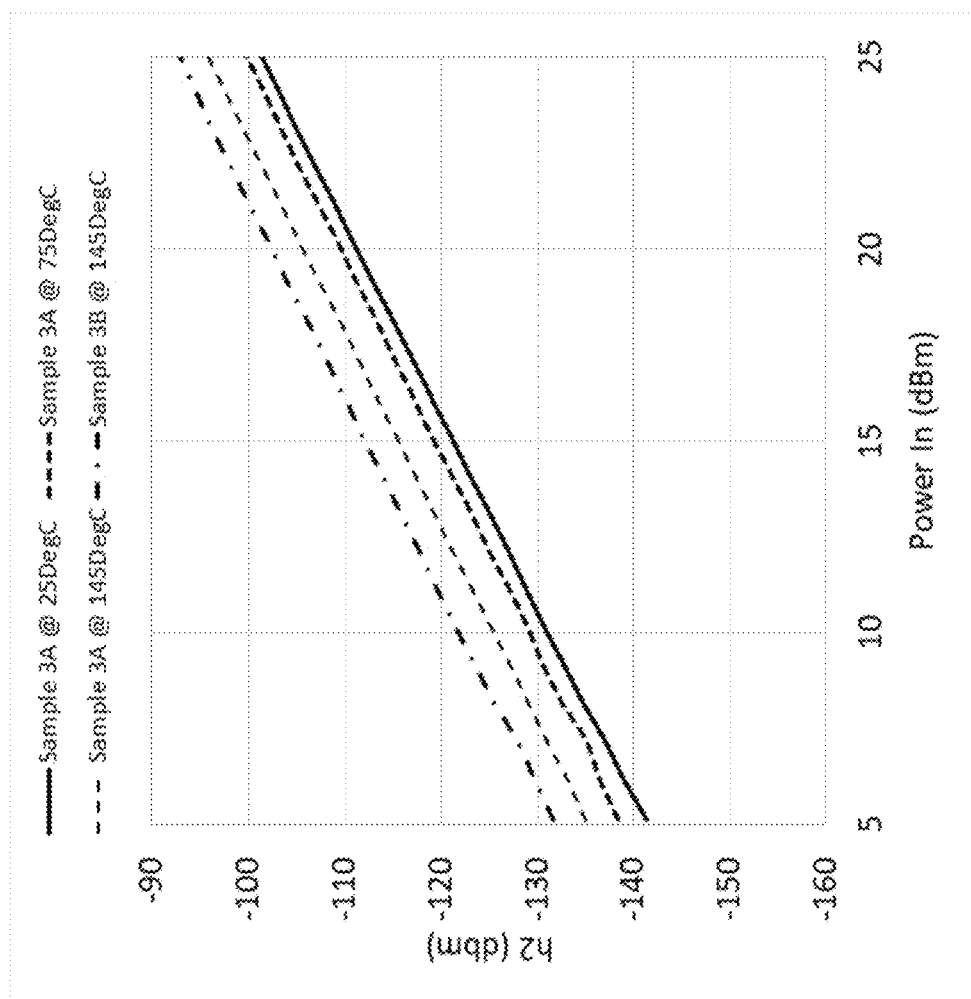
FIG. 36 shows a diagram of second harmonic distortion at different operating temperatures for a layered structure similar to the structure shown in FIG. 1, in accordance with some embodiments of the present disclosure.

FIG. 36 shows a diagram of second harmonic distortion at different operating temperatures for a layered structure similar to the structure shown in FIG. 1, according to embodiments described herein. Specifically, the diagram shows the second harmonic as a function of power in ($P_{in}$) at elevated temperatures.

FIG. 37 shows a diagram of effective permittivity vs. frequency for various examples for a layered structure, according to embodiments described herein. Specifically, the effective permittivity for examples of the layered structure is in a range of approximately 2 to 4 farads per meter for frequencies up to 20 GHz.

Figure 38:
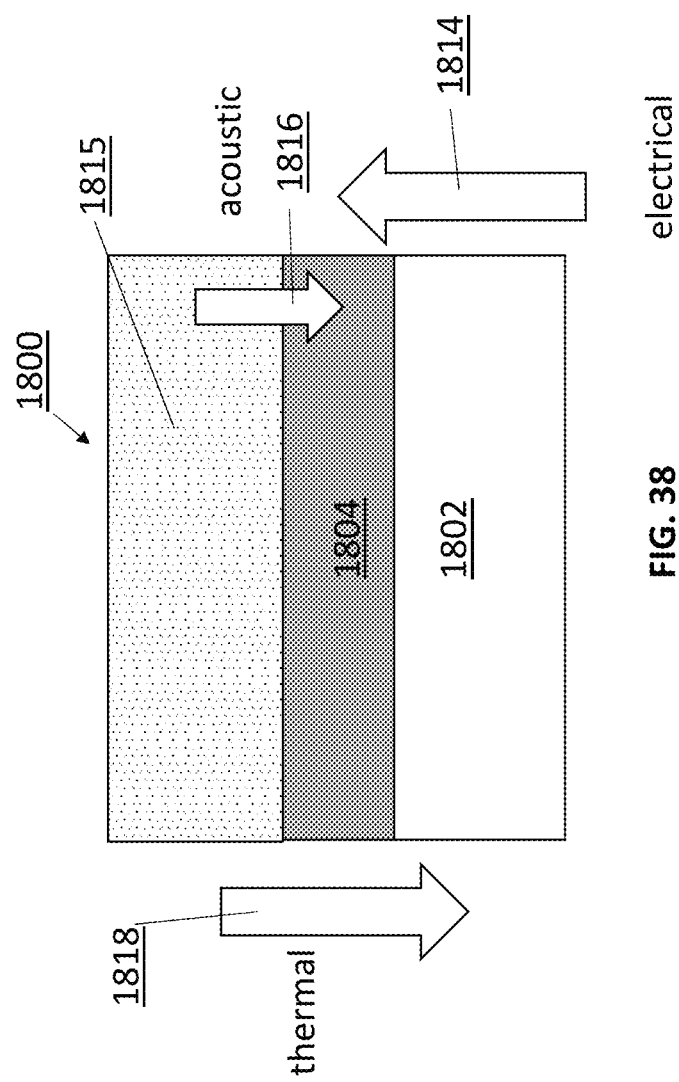
FIG. 38 shows an example of a layered structure including a fully depleted porous layer with an acoustic device, in accordance with some embodiments of the present disclosure.

FIG. 38 an example of a layered structure including a fully depleted porous layer with an acoustic device, according to embodiments described herein. The layered structure 1800 may include a starting material layer 1802, on which a fully depleted porous layer 1804 is formed and an acoustic device 1815 is formed over the fully depleted porous layer 1804. According to such a configuration, a flow of acoustic signals 1816, travels from the acoustic device 1815 towards the fully depleted porous layer. On the other hand, electrical flow 1814, travels from the substrate 1802 towards the fully depleted porous layer 1804. Finally, the thermal flow 1818 travels from the acoustic device through the fully depleted porous layer and to the substrate.

FIG. 39 is a flow diagram of an illustrative process for making a layered structure with a fully depleted porous layer, in accordance with some embodiments of the present disclosure. Process 1900 includes forming a fully depleted porous layer from a starting material, with a first band gap of the fully depleted porous layer is greater than a second band gap of the starting material. The fully depleted porous layer is elementally identical to a starting material.

In some embodiments, a starting material is prepared at 1902, in a suitable Dry-in/Dry-out porous silicon tool for forming the layered structure. The substrate may include gallium nitride, silicon carbide, sapphire, a silicon wafer, or any other suitable substrate, having a predetermined crystallographic orientation. The substrate may be doped to adjust the resistivity of the substrate. In some embodiments, the substrate may be a silicon wafer, doped with boron to a resistivity of in the range 0.1-10 ohm-cm. At 1904, the starting material is treated. The treatment is completed in a hydrofluoric acid and de-ionised water mixture having a ratio of (5:2) and surfactant (1 ml/l). At 1906, formation of the fully depleted porous layers on top of the starting material layers is performed by passing electrolyzing current through the starting material from cathode to anode. The electrolyzing current is passed for approximately typically of 10 seconds to 15 minutes. The current density for the porous formation process is in a range of 5-50 mA/cm2. At 1908, treating the fully depleted porous layer by post processing of the layer. The post processing can include drying the layer and providing a sealing layer to prepare for application with additional layers or devices.

FIG. 40 is a flow diagram of an illustrative process for making a layered structure with a starting material layer and forming an epitaxial layer, in accordance with some embodiments of the present disclosure. Process 2000 includes forming a fully depleted porous layer from a starting material, with a first band gap of the fully depleted porous layer is greater than a second band gap of the starting material. The fully depleted porous layer is elementally identical to a starting material. Further, epitaxially growing a semiconductor layer over the fully depleted porous layer.

In some embodiments, a starting material is prepared at 2002, in a suitable Dry-in/Dry-out porous silicon tool for forming the layered structure. The substrate may include gallium nitride, silicon carbide, sapphire, a silicon wafer, or any other suitable substrate, having a predetermined crystallographic orientation. The substrate may be doped to adjust the resistivity of the substrate. In some embodiments, the substrate may be a silicon wafer, doped with boron to a resistivity of in the range 0.1-10 ohm-cm. At 2004, the starting material is treated. The treatment is completed in a hydrofluoric acid and de-ionised water mixture having a ratio of (5:2) and surfactant (1 ml/l). At 2006, formation of the fully depleted porous layers on top of the starting material layers is performed by passing electrolyzing current through the starting material from cathode to anode. The electrolyzing current is passed for approximately typically of 10 seconds to 15 minutes. The current density for the porous formation process is in a range of 5-50 mA/cm2. At 2008, treating the fully depleted porous layer by post processing of the layer. The post processing can include drying the layer and providing a sealing layer to prepare for application with additional layers or devices. After the fully depleted porous layer is treated, an epitaxial layer may be formed over the fully depleted porous layer, at 2010.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" or "over" an underlying material or layer. This layer may include intermediate layers, such as transitional layers, necessary to ensure a suitable surface. For example, if a material is described to be "disposed on" or "over a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk gallium nitride wafers, bulk silicon carbide wafers, bulk sapphire wafers, bulk germanium wafers, bulk silicon wafers, in which a wafer comprises a homogeneous thickness of single-crystal material; composite wafers, such as a silicon-on-insulator wafer that comprises a layer of silicon that is disposed on a layer of silicon dioxide that is disposed on a bulk silicon handle wafer; or the porous germanium, germanium over oxide and silicon, germanium over silicon, patterned germanium, germanium tin over germanium, and/or the like; or any other material that serves as base layer upon which, or in which, devices are formed. Examples of such other materials that are suitable, as a function of the application, for use as substrate layers and bulk substrates include, without limitation, alumina, gallium-arsenide, indium-phosphide, silica, silicon dioxide, borosilicate glass, and pyrex. A substrate may have a single bulk wafer, or multiple sub-layers. Specifically, a substrate (e.g., silicon, germanium, etc.) may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

A first layer described and/or depicted herein as "configured on," "on," "formed over," or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure comprising:
a starting material layer; and
a fully depleted porous layer over the starting material layer,
wherein a first band gap of the fully depleted porous layer is greater than a second band gap of the starting material layer and the fully depleted porous layer is elementally identical to the starting material layer,
wherein the fully depleted porous layer comprises a first porosity in a first region and a second porosity in a second region, and
wherein the first and second regions are adjacent to each other in a horizontal direction.

2. The layered structure of claim 1, wherein the fully depleted porous layer is between 10-20 µm thick with resistivity greater than 10000 ohm-cm.

3. The layered structure of claim 1, wherein the starting material layer comprises silicon.

4. The layered structure of claim 1, wherein the starting material layer comprises a material having resistivity in a range of 0.1 to 10 ohm-cm.

5. The layered structure of claim 1, wherein the starting material layer comprises a plurality of layers stacked vertically, wherein a resistivity of the plurality of layers of the starting material layer varies.

6. The layered structure of claim 1, wherein the starting material layer is a silicon substrate with a <111> or <100> crystal orientation.

7. The layered structure of claim 1, wherein the fully depleted porous layer is lattice matched to the starting material layer.

8. The layered structure of claim 1, wherein the first region of the fully depleted porous layer comprises a plurality of sublayers stacked vertically, wherein a porosity of the plurality of sublayers is graded with a sublayer with a low porosity at a surface of the first region of the fully depleted porous layer, and a sublayer with a high porosity at an interface of the first region of the fully depleted porous layer and the starting material layer.

9. The layered structure of claim 1, wherein the first region of the fully depleted porous layer comprises a plurality of sublayers stacked vertically, wherein a porosity of the plurality of sublayers is graded with a sublayer with a high porosity at a surface of the first region of the fully depleted porous layer, and a sublayer with a low porosity at an interface of the first region of the fully depleted porous layer and the starting material layer.

10. The layered structure of claim 1, wherein the first region of the fully depleted porous layer comprises periodically alternating vertical sublayers of the first porosity and a third porosity.

11. The layered structure of claim 10, wherein the first porosity is a high porosity, and the third porosity is a low porosity.

12. The layered structure of claim 10, wherein the periodically alternating vertical sublayers of the first porosity and the third porosity form an acoustic reflector.

13. The layered structure of claim 10, wherein the periodically alternating vertical sublayers of the first porosity and the third porosity form a coherent phonon structure.

14. The layered structure of claim 1, wherein thermal conductivity of the layered structure is at least equal to 3 W/mK.

15. The layered structure of claim 1, wherein permittivity of the layered structure is in a range of approximately 2 to 4 farads per meter.

16. A layered structure comprising:
a starting material layer;
a fully depleted porous layer over the starting material layer, wherein a first band gap of the fully depleted porous layer is greater than a second band gap of the starting material layer and the fully depleted porous layer is elementally identical to the starting material layer; and
an epitaxial layer grown over the fully depleted porous layer,
wherein the fully depleted porous layer comprises a first porosity in a first region and a second porosity in a second region, and
wherein the first and second regions are adjacent to each other in a horizontal direction.

17. The layered structure of claim 16, wherein the epitaxial layer is a silicon semiconductor layer.

18. The layered structure of claim 16, wherein the epitaxial layer is selected from the group consisting of a InP layer, a cREO layer, a Mo layer, a AlGaInN layer, a RE-III-N layer and a metal layer.

19. The layered structure of claim 16, wherein the layered structure is a layer of an RF switch structure.

20. The layered structure of claim 16, wherein the layered structure is a layer of an integrated passive device.

21. The layered structure of claim 16, wherein the layered structure is a layer in an RF filter.

22. The layered structure of claim 16, wherein the starting material layer comprises a first region having a first resistivity and a second region having a second resistivity.

23. The layered structure of claim 22, wherein:
the fully depleted porous layer is formed over the first region; and
the layered structure further comprises a non-fully depleted porous layer formed over the second region.

24. The layered structure of claim 16, wherein the starting material layer is a silicon substrate with a <111> or <100> crystal orientation.

25. A method of forming a layered structure, the method comprising:
forming a fully depleted porous layer from a starting material,
wherein a first band gap of the fully depleted porous layer is greater than a second band gap of the starting material and the fully depleted porous layer is elementally identical to the starting material, and
wherein the fully depleted porous layer comprises a first porosity in a first region and a second porosity in a second region, and
wherein the first and second regions are adjacent to each other in a horizontal direction.

26. The method of claim 25, wherein the starting material is a p-type, boron doped substrate having a resistivity in the range of 0.1 to 10 ohm-cm.

27. The method of claim 25, further comprising:
growing an epitaxial layer over the fully depleted porous layer.

28. The method of claim 25, wherein the starting material is a silicon substrate with a <111> or <100> crystal orientation.

* * * * *